(12) United States Patent
Lee et al.

(10) Patent No.: US 11,756,464 B2
(45) Date of Patent: Sep. 12, 2023

(54) DISPLAY DEVICE AND METHOD FOR CONTROLLING THE SAME

(71) Applicant: LG ELECTRONICS INC., Seoul (KR)

(72) Inventors: Sanghee Lee, Seoul (KR); Yuri Lee, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 0 days.

(21) Appl. No.: 17/663,392

(22) Filed: May 13, 2022

(65) Prior Publication Data

US 2023/0186809 A1 Jun. 15, 2023

(30) Foreign Application Priority Data

Dec. 13, 2021 (KR) .................. 10-2021-0177441

(51) Int. Cl.
*G09G 3/00* (2006.01)
*H05K 5/02* (2006.01)
(Continued)

(52) U.S. Cl.
CPC ........... *G09G 3/035* (2020.08); *G06F 1/1652* (2013.01); *G06F 1/3231* (2013.01); *G09F 9/301* (2013.01);
(Continued)

(58) Field of Classification Search
CPC ...... G06F 3/041–047; G06F 2203/041–04114; G06F 1/1652; G06F 3/0412; G06F 2203/04102; G06F 1/1616; G09G 2380/02; B60J 7/0023; H01L 2251/5338; H01L 51/0097; H01L 2933/0058; H01L 33/58; H04N 13/302; H04N 13/363; G02F 1/133305;
(Continued)

(56) References Cited

U.S. PATENT DOCUMENTS 9,516,775 B2 12/2016 Park
2015/0296641 A1* 10/2015 Song .................... H05K 5/0217
361/679.01

(Continued)

FOREIGN PATENT DOCUMENTS

KR  10-2015-0062098  6/2015
KR     10-2325805   11/2021

OTHER PUBLICATIONS

PCT International Application No. PCT/KR2022/007551, Written Opinion of the International Searching Authority dated Sep. 13, 2022, 9 pages.

*Primary Examiner* — Sanjiv D. Patel
(74) *Attorney, Agent, or Firm* — LEE, HONG, DEGERMAN, KANG & WAIMEY PC

(57) ABSTRACT

A display device includes a main body configured to have a display module to which an image is output, a bending module located at a center of a back surface of the main body, and a controller. The controller controls the bending module to change a curvature of the display module to any one of a flat mode in which the display module is flat, a first bending mode in which the display module has a first curvature, and a second bending mode in which the display module has a second curvature. The second curvature is a maximum curvature of the display module.

13 Claims, 14 Drawing Sheets

(51) Int. Cl.
  *H05K 5/00* (2006.01)
  *G09F 9/30* (2006.01)
  *G06F 1/3231* (2019.01)
  *G06F 1/16* (2006.01)

(52) U.S. Cl.
  CPC ......... *H05K 5/0017* (2013.01); *H05K 5/0217* (2013.01); *G09G 2320/0626* (2013.01)

(58) Field of Classification Search
  CPC ......... G02F 1/133331; G02F 1/133603; G02F 1/133607; G09F 9/3026; G09F 9/33; G09F 9/301
  See application file for complete search history.

(56) References Cited

U.S. PATENT DOCUMENTS

| | | | |
|---|---|---|---|
| 2016/0055006 A1* | 2/2016 | In | G06F 1/1652 |
| | | | 713/2 |
| 2017/0124937 A1* | 5/2017 | Kim | G09G 3/2096 |
| 2018/0276942 A1* | 9/2018 | Whelan | G07F 17/3227 |
| 2018/0342212 A1* | 11/2018 | Gorilovsky | G09G 3/3413 |
| 2020/0192557 A1 | 6/2020 | Yi et al. | |
| 2020/0387035 A1* | 12/2020 | Oh | G02F 1/133621 |
| 2021/0259118 A1 | 8/2021 | Drabant | |

\* cited by examiner

FIG. 2
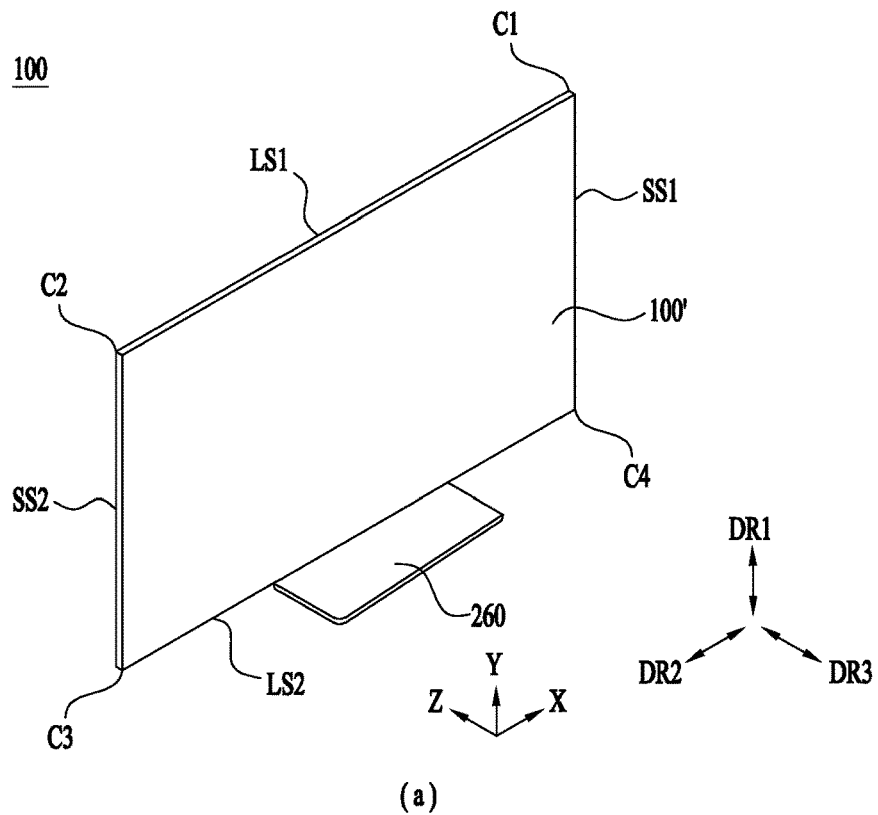
(a)
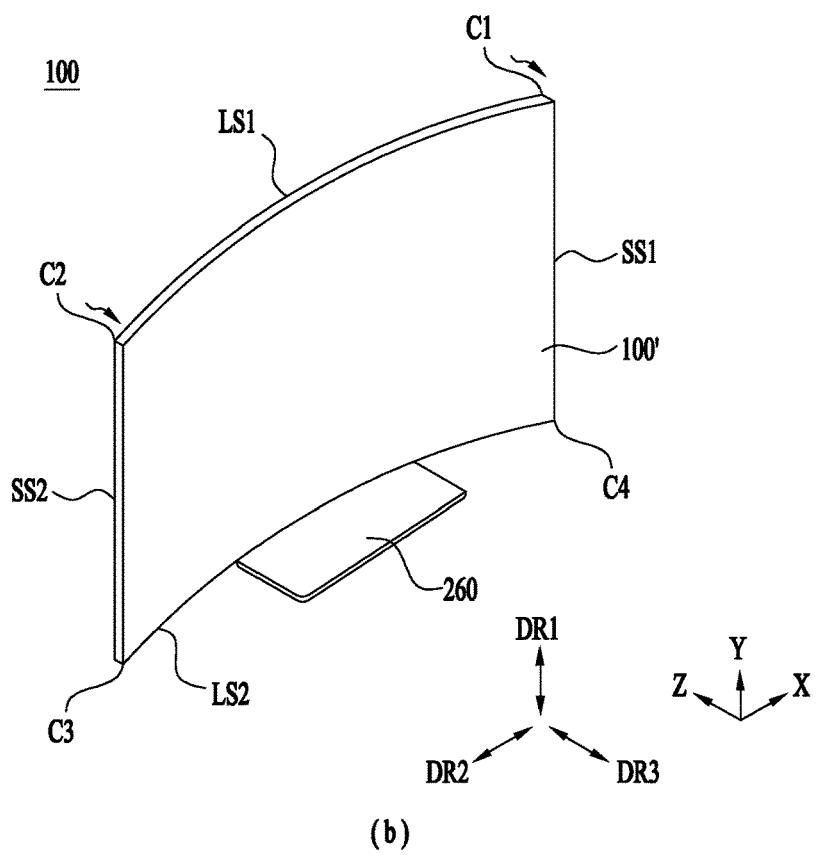
(b)

FIG. 6
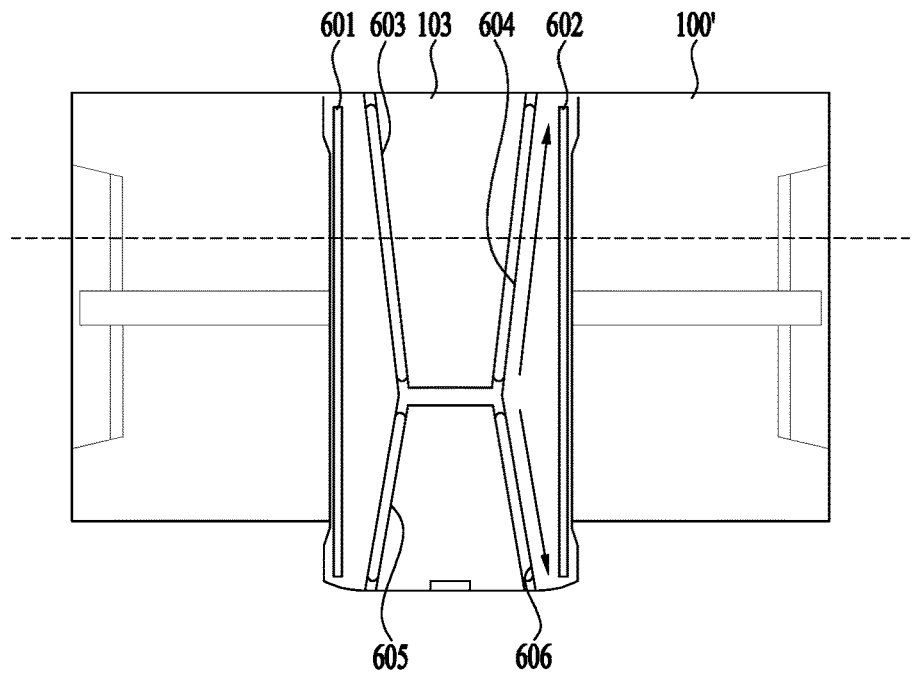
(a)
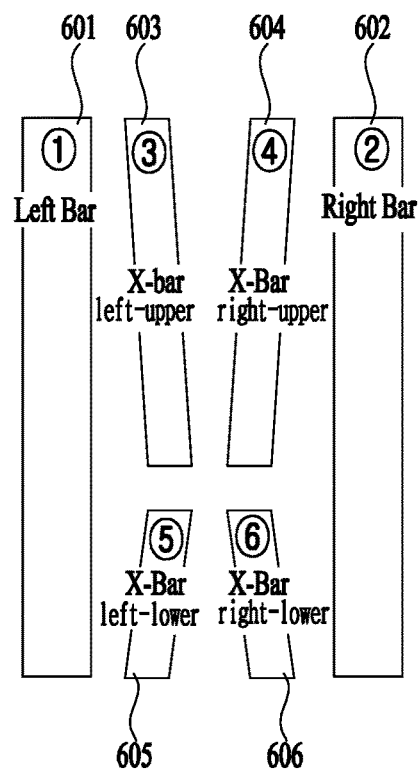
(b)

DISPLAY DEVICE AND METHOD FOR CONTROLLING THE SAME

Pursuant to 35 U.S.C. § 119(a), this application claims the benefit of earlier filing date and right of priority to Korean Patent Application No. 10-2021-0177441, filed on Dec. 13, 2021, the contents of which are all hereby incorporated by reference herein in its entirety.

BACKGROUND OF THE INVENTION

Field of the Invention

The present disclosure relates to a display device having a curved surface structure capable of improving the degree of immersion of a user who views the display device.

Discussion of the Related Art

With the increasing development of information society, the demand for display devices is also increasing in various forms. In response to this trend, various display devices, for example, Liquid Crystal Display (LCD), Field Emission Display (FED), Plasma Display Panel (PDP), an electroluminescent device, etc. have recently been developed.

A liquid crystal panel of the LCD may include a liquid crystal layer, may further include a thin film transistor (TFT) substrate and a color filter substrate that are arranged to face each other on the basis of the liquid crystal panel interposed therebetween, and may display an image using light provided from a backlight unit.

As an example of an electroluminescent device, active-matrix-type organic light emitting display (OLED) devices are commercially available on the market and widely used throughout the world. Since the OLED device is a self-emitting device, the OLED device has no backlight and is advantageous in terms of a response speed and a viewing angle as compared to the LCD, so that the OLED devices are attracting attention as next-generation displays.

As described above, since the OLED device has no backlight, the OLED device can be bent and deformed in shape, resulting in implementation of a curved display module. The curved display module can increase the sense of immersion of a user. However, when a plurality of users simultaneously views the curved display module, the plurality of users may feel inconvenience in viewing images displayed on the curved display as compared to a flat panel display.

SUMMARY OF THE INVENTION

Accordingly, the present disclosure is directed to a display device and a method for controlling the same that substantially obviate one or more problems due to limitations and disadvantages of the related art.

An object of the present disclosure is to provide a display device capable of changing a curvature thereof.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, a display device includes a main body configured to have a display module to which an image is output; a bending module located at a center of a back surface of the main body; and a controller. The controller controls the bending module to change a curvature of the display module to any one of a flat mode in which the display module is flat, a first bending mode in which the display module has a first curvature, and a second bending mode in which the display module has a second curvature. The second curvature is a maximum curvature of the display module.

The controller may switch the display module to any one of the flat mode, the first bending mode, and the second bending mode based on an image that is output from the display module.

When the controller receives a control signal for mode switching of the display module in a state where the display module operating in the first bending mode is outputting game content, the controller may switch the display module to the second bending mode.

The display device may further include, when the controller receives a control signal for mode switching of the display module in a state where the display module operating in the first bending mode is outputting any one of movie content, drama content, and web-browser content, the controller may switch the display module to the flat mode.

When the controller receives a control signal for adjusting the curvature of the display module, the controller may output a curvature setting menu through the sdisplay module, and controls the curvature of the display module to be adjusted in units of 100R through the curvature setting menu.

The display device may further include a memory. The controller may store information about the curvature adjusted in units of 100R in the memory, and may control the bending module to change the curvature of the display module based on the adjusted curvature.

Upon receiving a control signal for mode switching of the display module from a remote controller, the controller may transmit, to the remote controller, a signal for controlling the remote controller to vibrate.

The display device may further include a motion sensor. The controller may activate the motion sensor upon receiving a control signal for mode switching of the display module. When movement of an object is detected by the motion sensor within a preset range, the controller may output a pop-up window through the display module.

The controller may stop mode switching of the display module when movement of the object is detected by the motion sensor within the preset range.

When mode switching of the display module is performed in a state where the display module is powered on, the controller may control a speed of the mode switching to be a first speed. In a state where the display mode is powered off, when the display module is powered on and at the same time mode conversion of the display module is performed, the controller may control a speed of the mode switching to be a second speed. The second speed may be lower than the first speed.

The display device may further include at least one light, wherein the controller controls the at least one light to change brightness of light being output from the at least one light based on a mode change of the display module.

The at least one light may include six LED bars, wherein the six LED bars are symmetrical to each other with respect to a vertical axis.

The display device may further include a back cover configured to cover the main body and the controller, wherein the at least one light is disposed on the back cover.

The display device may further include one pair of links having one end coupled to the bending module, and extending in a horizontal direction, and a link bracket disposed at left and right ends of the main body and connected to the other end of the links. The bending module may include a guide shaft extending from a back surface of the main body, and a moving block inserted into the guide shaft and configured to move forward and backward. When the moving block moves forward and backward along the guide shaft, an angle between the links is changed and the curvature of the display module is also changed.

In accordance with another aspect of the present disclosure, a method for controlling a display device which includes a main body having a display module to which an image is output, and a bending module located at a center of a back surface of the main body may include outputting an image through the display module of the display device; and controlling the bending module to change a curvature of the display module to any one of a flat mode in which the display module is flat, a first bending mode in which the display module has a first curvature, and a second bending mode in which the display module has a second curvature, wherein the second curvature is a maximum curvature of the display module.

It is to be understood that both the foregoing general description and the following detailed description of the present disclosure are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings:

FIG. 2 is a perspective view illustrating an example of a display device according to an embodiment of the present disclosure.

FIG. 6 is a diagram illustrating a light structure of a display device according to an exemplary embodiment of the present disclosure.

DESCRIPTION OF SPECIFIC EMBODIMENTS

Figure 1:
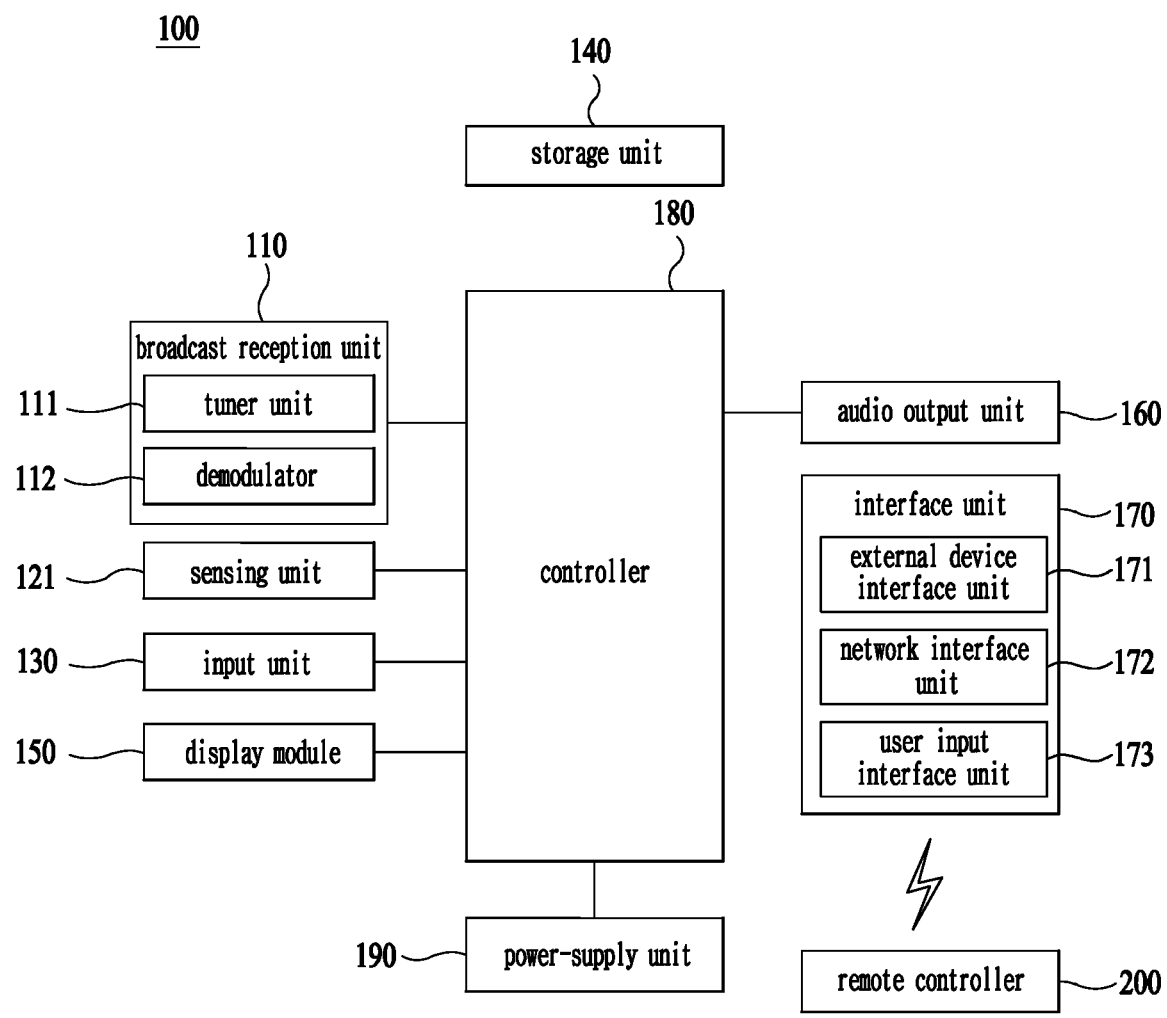
FIG. 1 is a block diagram illustrating constituent elements of a display device according to an embodiment of the present disclosure.

Description will now be given in detail according to exemplary embodiments disclosed herein, with reference to the accompanying drawings. For the sake of brief description with reference to the drawings, the same or equivalent components may be provided with the same reference numbers, and description thereof will not be repeated. In general, a suffix such as "module" and "unit" may be used to refer to elements or components. Use of such a suffix herein is merely intended to facilitate description of the specification, and the suffix itself is not intended to give any special meaning or function. In the present disclosure, that which is well-known to one of ordinary skill in the relevant art has generally been omitted for the sake of brevity. The accompanying drawings are used to help easily understand various technical features and it should be understood that the embodiments presented herein are not limited by the accompanying drawings. As such, the present disclosure should be construed to extend to any alterations, equivalents and substitutes in addition to those which are particularly set out in the accompanying drawings.

It will be understood that although the terms first, second, etc. may be used herein to describe various elements, these elements should not be limited by these terms. These terms are generally only used to distinguish one element from another.

It will be understood that when an element is referred to as being "connected with" another element, the element can be directly connected with the other element or intervening elements may also be present. In contrast, when an element is referred to as being "directly connected with" another element, there are no intervening elements present.

A singular representation may include a plural representation unless it represents a definitely different meaning from the context.

Terms such as "include" or "has" are used herein and should be understood that they are intended to indicate an existence of several components, functions or steps, disclosed in the specification, and it is also understood that greater or fewer components, functions, or steps may likewise be utilized.

On the other hand, the image display device described herein is, for example, an intelligent image display device implemented by adding a computer support function to a broadcast reception function, and further includes an Internet function or the like while sufficiently performing the broadcast reception function, so that the image display device may have user-friendly interfaces such as a handwriting input device, a touchscreen, or a spatial remote controller. Further, the image display device can support a wired or wireless Internet function by connecting to the Internet and a computer device, thereby performing e-mailing, web browsing, banking, or gaming. To implement these functions, the image display device may operate based on a standard general-purpose Operating System (OS).

Accordingly, the image display device according to the present disclosure is designed in a manner that various applications can be easily added to or deleted from a general-purpose OS kernel so that the image display device can perform various user-friendly functions. The image display device may be, for example, a network TV, a Hybrid broadcast broadband TV (HBBTV), a smart TV, etc. The image display device is applicable to a smartphone as needed.

FIG. 1 is a block diagram illustrating constituent elements of a display device 100 according to an embodiment of the present disclosure.

Referring to FIG. 1, the display device 100 may include a broadcast reception unit 110, an external device interface unit 171, a network interface unit 172, a storage unit 140, a user input interface unit 173, an input unit 130, a controller 180, a display 150, an audio output unit 160, and/or a power-supply unit 190.

The broadcast reception unit 110 may include a tuner unit 111 and a demodulator 112.

Although not shown in the drawings, the display device 100 may include only the external device interface unit 171 and the network interface unit 172 from among the broadcast reception unit 110, the external device interface unit 171, and the network interface unit 172. That is, the display device 100 may not include the broadcast reception unit 110.

The tuner unit 111 may select a broadcast signal corresponding to either a user-selected channel or all prestored channels from among broadcast signals received through an antenna (not shown) or a cable (not shown). The tuner unit 111 may convert the selected broadcast signal into an intermediate frequency (IF) signal or a baseband image or a voice signal.

For example, when the selected broadcast signal is a digital broadcast signal, the tuner unit 111 may convert the selected broadcast signal into a digital IF (DIF) signal. When the selected broadcast signal is an analog broadcast signal, the tuner unit 111 may convert the selected broadcast signal into an analog baseband image or a voice signal (CVBS/SIF). That is, the tuner unit 111 may process the digital broadcast signal or the analog broadcast signal. The analog baseband image or the voice signal (CVBS/SIF) output from the tuner unit 111 may be directly input to the controller 180.

The tuner unit 111 may sequentially select broadcasting signals of all broadcasting channels stored through a channel memory function from among the received broadcast signals, and may convert the selected broadcast signal into an intermediate frequency (IF) signal or a baseband image or a voice signal.

The tuner unit 111 may include a plurality of tuners to receive broadcast signals of the plurality of channels. Alternatively, a single tuner for simultaneously receiving broadcast signals of the plurality of channels is also possible.

The demodulator 112 may receive the digital IF signal (DIF) converted by the tuner unit 111, and may thus perform demodulation of the received signal. The demodulator 112 may perform demodulation and channel decoding, and may output a stream signal (TS). The stream signal may be a signal formed by multiplexing an image signal, a voice signal, or a data signal.

The stream signal (TS) output from the demodulator 112 may be input tio the controller 180. The controller 180 may perform demultiplexing, image/audio signal processing, etc., may output an image through the display 150, and may output a voice through the audio output unit 160.

The sensing unit 120 may sense a change in the display device 100 or may sense an external change. For example, the sensing unit 120 may include a proximity sensor, an illumination sensor, a touch sensor, an infrared (IR) sensor, an ultrasonic sensor, an optical sensor (e.g., a camera), a voice sensor (e.g., a microphone), a battery gauge, environmental sensors (e.g., hygrometer, a thermometer, etc.).

The controller 180 may check a state of the display device 100 based on information collected by the sensing unit 120, may notify the user of a problem, or may control the display device 100 to be kept in the best state.

In addition, it is possible to provide an optimal viewing environment by differently controlling the content, image quality, size, etc. of the image provided to the display module 180 depending on the viewer, ambient illuminance, etc. sensed by the sensing unit. As the smart TV has evolved, the number of functions mounted in the display device increases, and the number of the sensing units 20 also increases together with the increasing functions.

The input unit 130 may be provided at one side of a main body of the display device 100. For example, the input unit 130 may include a touch pad, a physical button, and the like. The input unit 130 may receive various user commands related to the operation of the display device 100, and may transmit a control signal corresponding to the input command to the controller 180.

Recently, as a bezel of the display device 100 decreases in size, the number of display devices 100 each including a minimum number of input unit 130 formed in a physical button exposed to the outside is rapidly increasing. Instead, a minimum number of physical buttons may be provided on the back or side surface of the display device 100. The display device may receive a user input through the remote controller 200 through a touchpad or a user input interface unit 173 to be described later.

The storage unit 140 may store a program for processing and controlling each signal used in the controller 180, and may store a signal-processed image, a voice, or a data signal. For example, the storage unit 140 may store application programs designed for the purpose of performing various tasks that can be processed by the controller 180, and may selectively provide some of the stored application programs upon request of the controller 180.

The program stored in the storage unit 140 is not specifically limited to being executed by the controller 180. The storage unit 140 may perform a function for temporarily storing an image, a voice, or a data signal received from an external device through the external device interface unit 171. The storage unit 140 may store information about a predetermined broadcast channel through a channel memory function such as a channel map.

Although the storage unit 140 of FIG. 1 is provided separately from the controller 180, the scope of the present disclosure is not limited thereto, and the storage unit 140 may also be included in the controller 180 as needed.

The storage unit 140 may include at least one of a volatile memory (e.g., DRAM, SRAM, SDRAM, etc.) and a nonvolatile memory (e.g., flash memory, hard disk drive (HDD), solid state drive (SSD), etc.).

The display 150 may generate a drive signal by converting an image signal, a data signal, an OSD signal, a control signal processed by the controller 180, or by converting an image signal, a data signal, a control signal, etc. received from the interface unit 171. The display 150 may include a display panel 181 having a plurality of pixels.

A plurality of pixels included in the display panel may include RGB sub-pixels. Alternatively, a plurality of pixels included in the display panel may include sub-pixels of RGBW. The display 150 may convert the image signal, the data signal, the OSD signal, the control signal, etc. processed by the controller 180 to generate a drive signal for the plurality of pixels.

The display 150 may be implemented as a plasma display panel (PDP), a liquid crystal display (LCD), an organic light emitting diode (OLED), a flexible display, etc. In addition, the display 150 may also be implemented as a three-dimensional (3D) display. The three-dimensional (3D) display 150 may be classified into a glassless-type 3D display and a glasses-type 3D display.

The display device may include a display module that occupies most parts of the front surface, and a case that covers the back and side surfaces of the display module and packages the display module.

Recently, the display device 100 has evolved from a flat-screen display to a curved-screen display. In order to implement the curved screen, the display device 100 may use a display module 150 that can be bent or curved, such as a light emitting diode (LED) or an organic light emitting diode (OLED), etc.

Conventionally, the LCD has difficulty in self-emitting light, so that the conventional LCD has been designed to receive light through a backlight unit. The backlight unit is a device for uniformly supplying light received from a light source to a liquid crystal located on the front surface of the display device. As the backlight becomes thinner, a thin LCD can be implemented. However, it is actually difficult for the backlight unit to be implemented as a curved structure formed of a flexible material. Although the backlight unit is implemented as a curved shape, it is difficult for light to be uniformly applied to the liquid crystal, thereby changing brightness of the screen.

On the other hand, the LED or the OLED is designed in a manner that each of constituent elements constructing the pixels can self-emit light without using the backlight unit, so that the LED or the OLED can be implemented as a curved shape without any problems. In addition, since each element can perform self-emission of light, brightness of each element is not affected by a change in the positional relationship between the element and adjacent elements, so that a curved display module 150 can be implemented as an LED or OLED.

OLED (Organic Light Emitting Diode) panels appeared in earnest in mid-2010 and are rapidly replacing LCDs in the small- and medium-sized display market. The OLED is a display made using the self-emission characteristics in which OLED emits light when a current flows in a fluorescent organic compound. Since the response speed of the OLED is faster than that of the LCD, there is little afterimage when moving images are implemented.

OLEDs may be used as a light-emitting display product. In this case, the light-emitting display device may use three fluorescent organic compounds (such as red, green, and blue) each having a self-emitting function, and may use the self-emitting phenomenon in which positive(+)-charged particles and electrons injected from a cathode and anode are combined with each other within the organic material, so that a backlight unit causing degradation of color sense need not be used.

The LED panel is implemented by technology for using only one LED element as one pixel, and has a smaller LED element compared to the prior art, so that a curved display module 150 can be implemented. Whereas the conventional device referred to as an LED TV can use the LED as a light source of the backlight unit for supplying light to the LCD, it is impossible for the LED of the conventional device to constitute a screen.

The display module may include a display panel, a coupling magnet located on the rear surface of the display panel, a first power-supply unit, and a first signal module. The display panel may include a plurality of pixels (R, G, B). The plurality of pixels (R, G, B) may be formed in each region where a plurality of data lines and a plurality of gate lines cross each other. The plurality of pixels (R, G, B) may be arranged in a matrix.

For example, the plurality of pixels (R, G, B) may include a red (R) sub-pixel, a green (G) sub-pixel, and a blue (B) sub-pixel. The plurality of pixels (R, G, B) may further include white (W) sub-pixel(s).

In the display module 150, one side where an image is displayed may be referred to as a front side or a front surface. When the display module 150 displays an image, one side where no image is observed may be referred to as a rear side or a rear surface.

Meanwhile, the display 150 may be implemented as a touchscreen, so that the display 150 can also be used as an input device in addition to an output device.

The audio output unit 160 may receive a voice-processed signal from the controller 180, and may output the received signal as a voice signal.

The interface unit 170 may serve as a path of connection to various kinds of external devices connected to the display device 100. The interface unit may include not only a wired method for transmitting/receiving data through a cable, but also a wireless method using the antenna.

The interface unit 170 may include at least one of a wired/wireless headset port, an external charger port, a wired/wireless data port, a memory card port, a port connected to a device having an identification module, an audio input/output (I/O) port, a video I/O port, and an earphone port.

As an example of a wireless method, the above-described broadcast reception unit 110 may be used. The broadcast reception unit 110 may be configured to use a broadcast signal, a mobile communication short-range communication signal, a wireless Internet signal, and the like.

The external device interface unit 171 may transmit or receive data to and from a connected external device. To this end, the external device interface unit 171 may include an A/V input/output (I/O) unit (not shown).

The external device interface unit 171 may be wired or wirelessly connected to an external device such as a digital versatile disc (DVD) player, a Blu-ray player, a game console, a camera, a camcorder, a computer (laptop), a set-top box, or the like, and may perform an input/output (I/O) operation with the external device.

In addition, the external device interface unit 171 may establish a communication network with various remote controllers 200, may receive a control signal related to operation of the display device 100 from the remote controller 200, or may transmit data related to operation of the display device 100 to the remote controller 200.

The external device interface unit 171 may include a wireless communication unit (not shown) for short-range wireless communication with other electronic devices. Through the wireless communication unit (not shown), the external device interface unit 171 may exchange data with an adjacent mobile terminal. In particular, the external device interface unit 171 may receive device information, application information, an application image, and the like from the mobile terminal in a mirroring mode.

The network interface unit 172 may provide an interface for connecting the display device 100 to a wired/wireless network including the Internet network. For example, the network interface unit 172 may receive content or data provided by the Internet, a content provider, or a network administrator through a network. The network interface unit 172 may include a communication module (not shown) for connection with the wired/wireless network.

The external device interface unit 171 and/or the network interface unit 172 may include a communication module for short-range communication such as Wi-Fi, Bluetooth, Bluetooth low energy (BLE), ZigBee, Near Field Communication (NFC), and a communication module for cellular communication such as Long-Term Evolution (LTE), LTE-A (LTE Advanced), Code Division Multiple Access (CDMA), WCDMA (wideband CDMA), UMTS (universal mobile telecommunications system), WiBro (Wireless Broadband), etc.

The user input interface unit 173 may transmit user input signals to the controller 180, or may transmit signals received from the controller 180 to the user. For example, the user input interface unit 173 may transmit or receive user input signals (such as a power-on/off signal, a channel selection signal, and a screen setting signal) to and from the remote controller 200, may transmit user input signals received through a local key (not shown) such as a power key, a channel key, a volume key, and a setting key to the controller 180, may transmit a user input signal received by a sensor unit (not shown) for sensing a user gesture to the controller 180, or may transmit a signal received from the controller 180 to the sensor unit.

The controller 180 may include at least one processor, and may control the overall operation of the display device 100 using the processor included therein. Here, the processor may be a general processor such as a CPU. Of course, the processor may be a dedicated device such as an ASIC, or other hardware-based processor.

The controller 180 may demultiplex the stream received through the tuner unit 111, the demodulator 112, the external device interface unit 171, or the network interface 172, and may process the demultiplexed signals to generate and output a signal for image or voice output.

The image signal processed by the controller 180 may be input to the display 150 and displayed as an image corresponding to the corresponding image signal. In addition, the image signal processed by the controller 180 may be input to the external output device through the external device interface unit 171.

The voice (or audio) signal processed by the controller 180 may be audibly output to the audio output unit 160. In addition, the voice signal processed by the controller 180 may be input to the external output device through the external device interface unit 171. Although not shown in FIG. 2, the controller 180 may include a demultiplexer, an image processor, and the like, and a detailed description thereof will hereinafter be described with reference to FIG. 3.

In addition, the controller 180 may control the overall operation of the display device 100. For example, the controller 180 may control the tuner unit 111 to select a broadcast program corresponding to either a user-selected channel or a prestored channel.

In addition, the controller 180 may control the display device 100 by a user command or an internal program received through the user input interface unit 173. The controller 180 may control the display 150 to display an image. In this case, the image displayed on the display 150 may be a still image or a moving image, and may be a 2D image or a 3D image.

On the other hand, the controller 180 may display a predetermined 2D object in the image displayed on the display 150. For example, the object may be at least one of a connected web screen (newspaper, magazine, etc.), electronic program guide (EPG), various menus, widgets, icons, still images, moving images, and text.

Meanwhile, the controller 180 may modulate and/or demodulate the signal using an amplitude shift keying (ASK) scheme. Here, the ASK scheme may refer to a method for modulating a signal by differentiating the amplitude of a carrier wave according to data values or for restoring an analog signal to a digital data value according to the amplitude of the carrier wave.

For example, the controller 180 may modulate an image signal using the ASK scheme, and may transmit the modulated signal through a wireless communication module.

For example, the controller 180 may demodulate and process the image signal received through the wireless communication module using the ASK scheme.

Accordingly, the display device 100 may simply transmit and receive signals to and from other image display devices arranged adjacent to each other without using either a unique identifier such as a Media Access Control (MAC) address or a complex communication protocol such as TCP/IP.

On the other hand, the display device 100 may further include a photographing unit (not shown). The photographing unit may photograph a user. The photographing unit may be implemented as one camera, but is not limited thereto, and may be implemented by a plurality of cameras. On the other hand, the photographing unit may be embedded in the display device 100 or may be separately arranged on the display 150. The image information photographed by the photographing unit may be input to the controller 180.

The controller 180 may recognize the position of the user based on the image photographed by the photographing unit. For example, the controller 180 may recognize a distance (z-axis coordinates) between the user and the display device 100. In addition, the controller 180 may recognize the X-axis coordinate and the Y-axis coordinate within the display 150 corresponding to the user position.

The controller 180 may sense a user gesture based on an image photographed by the photographing unit, each of signals detected by the sensor unit, or a combination thereof.

The power-supply unit 190 may supply corresponding power to the display device 100. In particular, the controller 180 may be implemented as a System on Chip (SoC), a display 150 for displaying an image, and an audio output unit 160 for audio output.

Specifically, the power-supply unit 190 may include a converter (not shown) for converting AC power into DC power, and a DC/DC converter (not shown) for converting the level of DC power.

On the other hand, the power-supply unit 190 may receive power from the external power source, and may distribute the received power to the respective components. The power-supply unit 190 may be directly connected to the external power source to supply AC power, and may include a battery capable of being charged with electricity.

In the former case, the power-supply unit 190 may be used by connecting to a wired cable, and it is difficult for the power-supply unit 190 to move from one place to another place, and the movement range of the power-supply unit 190 is limited. In the latter case, the power-supply unit 190 can move from one place to another place, but the weight and volume of the power-supply unit 190 may increase as much as the weight and volume of the battery. In addition, for charging, the power-supply unit 190 should be directly connected to a power cable for a predetermined period of time or should be coupled to a charging cradle (not shown) for power supply.

The charging cradle may be connected to the display device through a terminal exposed to the outside. Alternatively, if the power-supply unit 190 approaches the charging cradle using a wireless interface, a built-in battery of the power-supply unit 190 may also be charged with electricity.

The remote controller 200 may transmit a user input to the user input interface unit 173. To this end, the remote controller 200 may use Bluetooth, Radio Frequency (RF) communication, infrared (IR) communication, Ultra-Wideband (UWB), ZigBee, or the like. In addition, the remote controller 200 may receive the image, voice, or data signal output from the user input interface unit 173, and may display or audibly output the received image, voice, or data signal.

On the other hand, the above-described display device 100 may be a fixed or mobile digital broadcast receiver capable of receiving digital broadcast signals.

Meanwhile, the block diagram of the display device 100 shown in FIG. 1 is disclosed for only for illustrative purposes for one embodiment of the present disclosure, and the respective components of the display device 100 shown in FIG. 1 can be integrated, added or omitted according to the specifications of the digital device 100 which is actually implemented.

That is, if necessary, two or more components may be combined into one component, or one component may be subdivided into two or more components. In addition, the functions performed in each block are intended to explain the embodiment of the present disclosure, and the specific operation or device does not limit the scope of the present disclosure.

FIG. 2 is a perspective view illustrating an example of the display device according to an embodiment of the present disclosure.

Referring to FIG. 2, the display device 100 may have a rectangular body 100' including a first long side (LS1), a second long side (LS2) facing the first long side (LS1), a first short side (SS1) adjacent to the first long side (LS1) and the second long side (LS2), and a second short side (SS2) facing the first short side (SS1).

Here, the first short side area (SS1) is referred to as a first side area. The second short side area (SS2) is referred to as a second side area facing the first side area. The first long side area (LS1) is referred to as a third side area that is adjacent to the first side area and the second side area while being disposed between the first side area and the second side area. The second long side area (LS2) is referred to as a fourth side area that is adjacent to the first side area and the second side area while being disposed between the first side area and the second side area.

In addition, although the length of the first and second long sides LS1 and LS2 is longer than the length of the first and second short sides SS1 and SS2 as shown in FIG. 2, the scope of the present disclosure is not limited thereto, and the length of the first and second long sides LS1 and LS2 may also be approximately the same as the length of the first and second short sides SS1 and SS2 as needed.

In addition, the first direction (DR1) may be a direction parallel to each of the long sides LS1 and LS2 of the display device 100, and the second direction (DR2) may be a direction parallel to each of the short sides SS1 and SS2 of the display device 100. The third direction (DR3) may be a direction perpendicular to the first direction (DR1) and/or the second direction (DR2).

From another point of view, the side where the display device 100 displays an image may be referred to as a front side or a front surface. When the display device 100 displays an image, the side where no image is observed may be referred to as a back side or a back surface. When the display device 100 is viewed from the front side or the front surface, the first long side (LS1) may be referred to as an upper side or an upper surface. Similarly, the second long side (LS2) may be referred to as a lower side or a lower surface. Similarly, the first short side (SS1) may be referred to as a right side or a right surface, and the second short side (SS2) may be referred to as a left side or a left surface.

In addition, the first long side (LS1), the second long side (LS2), the first short side (SS1), and the second short side (SS2) may be referred to as an edge of the display device 100. A point where the first long side (LS1), the second long side (LS2), the first short side (SS1), and the second short side (SS2) meet each other may be referred to as a corner. For example, a point where the first long side (LS1) and the first short side (SS1) meet each other may be referred to as a first corner (C1). A point where the first long side (LS1) and the second short side (SS2) meet each other may be referred to as a second corner (C2). A point where the second short side (SS2) and the second long side (LS2) meet each other may be referred to as a third corner (C3). A point where the second long side (LS2) and the first short side (SS1) meet each other may be referred to as a fourth corner (C4).

Here, the direction from the first short side (SS1) to the second short side (SS2) or the direction from the second short side (SS2) to the first short side (SS1) may be referred to as a horizontal direction (LR). The direction from the first long side (LS1) to the second long side (LS2) or from the second long side (LS2) to the first long side (LS1) may be referred to as a vertical direction (UD).

The display device 100 according to the present disclosure may change the shape of the display module 150 using the LED or OLED instead of a liquid crystal, as shown in FIG. 2(*a*) or FIG. 2(*b*). That is, the backlight unit may be omitted, and the display device can be changed in shape within a predetermined range, so that the curved display device 100 can be implemented as shown in FIG. 2(*b*) using the above-described characteristics.

The display device 100 according to the present disclosure is a variable display device 100 in which a user can adjust a curvature according to a situation, rather than a curved display device fixed in a curved state. The display device 100 may further include a curvature adjustment unit capable of changing a curvature of the main body 100' configured to include the display module 150.

Figure 3:
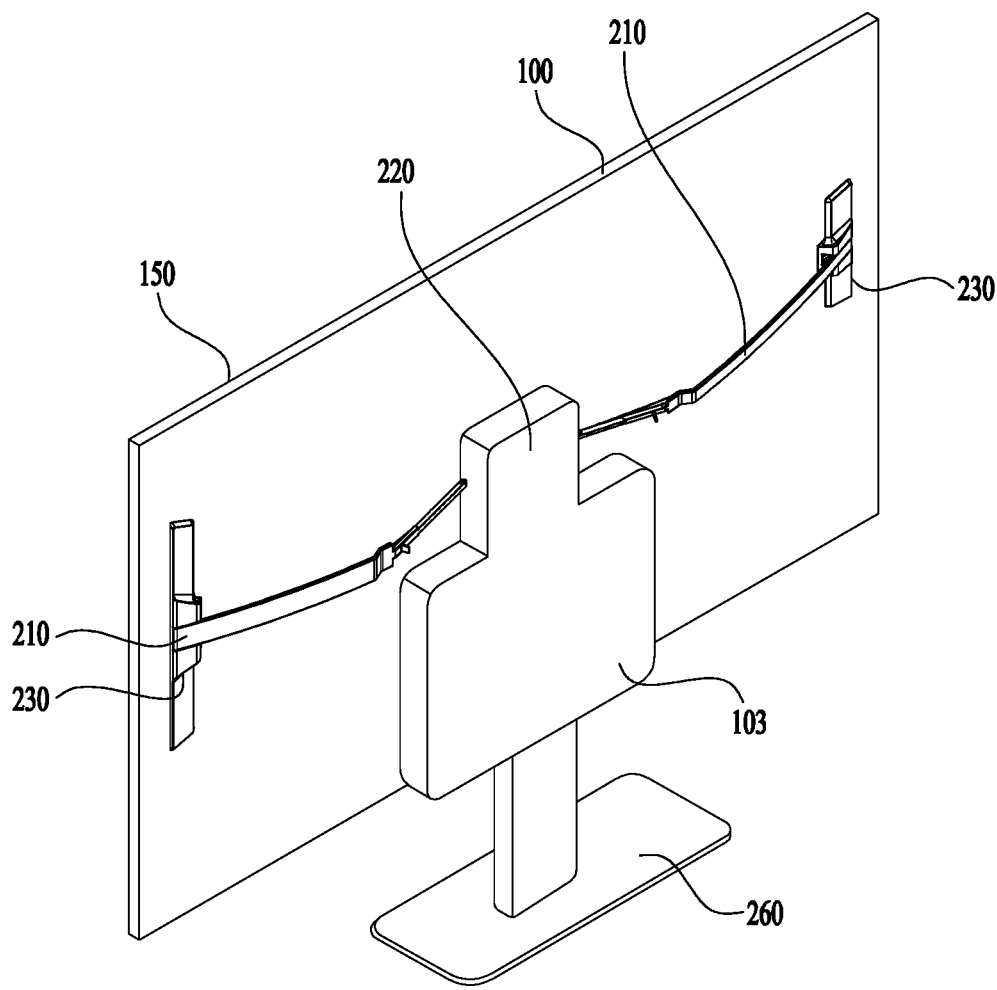
FIG. 3 is a rear view illustrating a display device according to an embodiment of the present disclosure.
Figure 4:
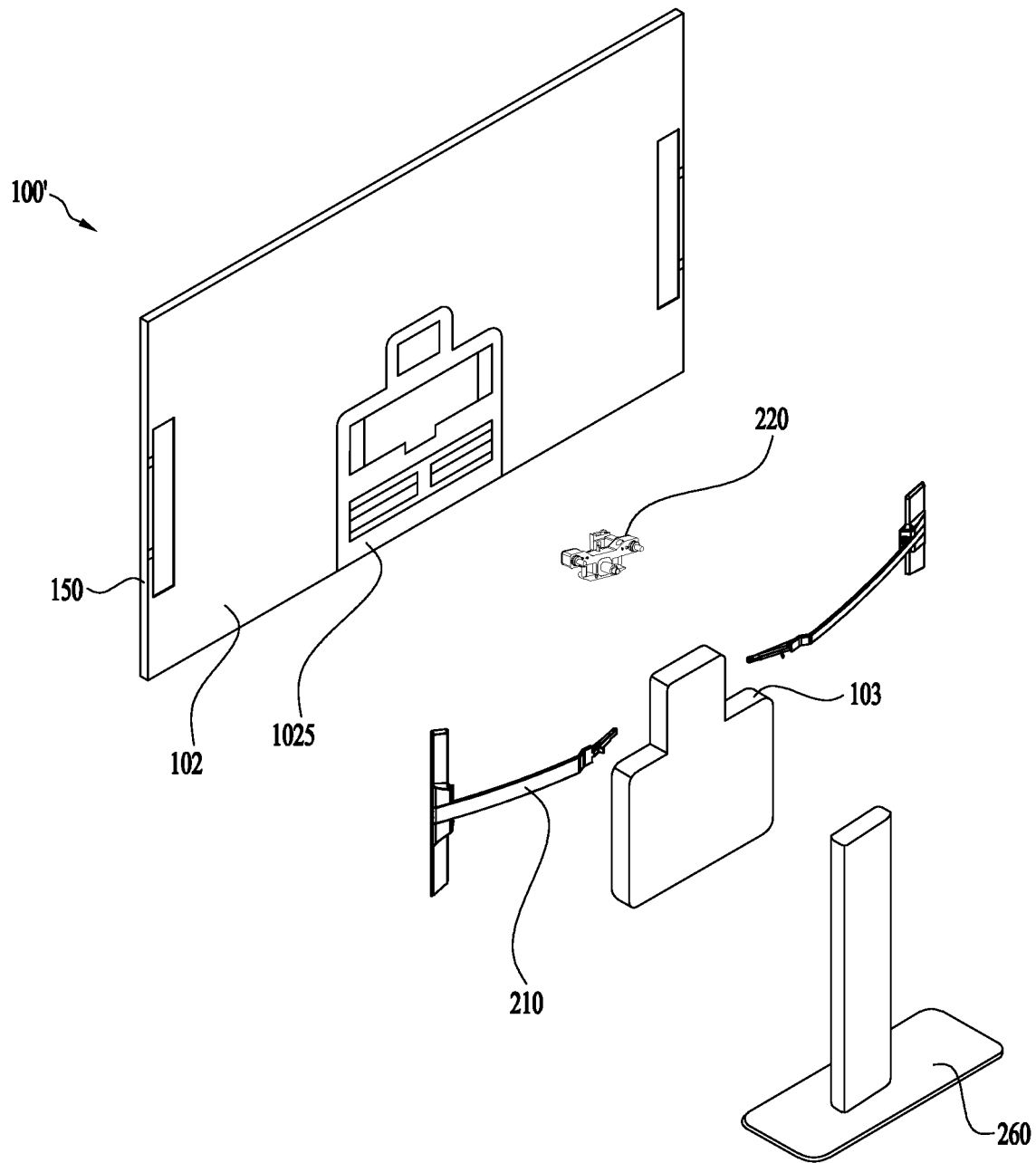
FIG. 4 is an exploded perspective view illustrating a display device according to an embodiment of the present disclosure.

FIG. 3 is a rear view illustrating the display device 100 according to an embodiment of the present disclosure. FIG. 4 is an exploded perspective view illustrating the display device 100 according to an embodiment of the present disclosure. Referring to FIGS. 3 and 4, the display device 100 may include a main body 100', a stand 260 for mounting the main body 100' on the floor, a controller 180, and curvature adjustment units 210, 220, and 230.

The main body 100' including the display module 150 may include a cover bottom 102 that covers a back surface of the display module 150 to which an image is output. A heat dissipation structure for discharging heat generated by the display module 150 may be provided at the inner surface of the cover bottom 102, and the main body 100' may further include a reinforcing material for reinforcing rigidity.

The cover bottom 102 may cover the back surface of the display module 150, may reinforce the rigidity of the display module 150, and may protect the back surface of the display module 150. In particular, the display module 150 may cover a driving IC of the display extending in a backward direction of the display module 150. A main substrate may be mounted on the back surface of the cover bottom 102 as a controller for controlling the display module 150, and a hole may be formed in the cover bottom 102 to interconnect the main substrate and the driving IC of the display module 150.

A separate bracket 1025 may be further provided so that the controller 180, such as a main board, can be mounted thereto. The display device 100 according to the present disclosure may further include a curvature adjustment unit for changing the curvature of the main body 100' other than the controller for controlling the display module 150 on the back surface of the cover bottom 102.

The curvature adjustment unit may further include a pair of links 210, a bending module 220 located at the center of the display device 100 and coupled to one end of the pair of links 210, and a pair of link brackets 230 disposed between the other end of the pair of links 210 and the cover bottom 102.

Figure 5:
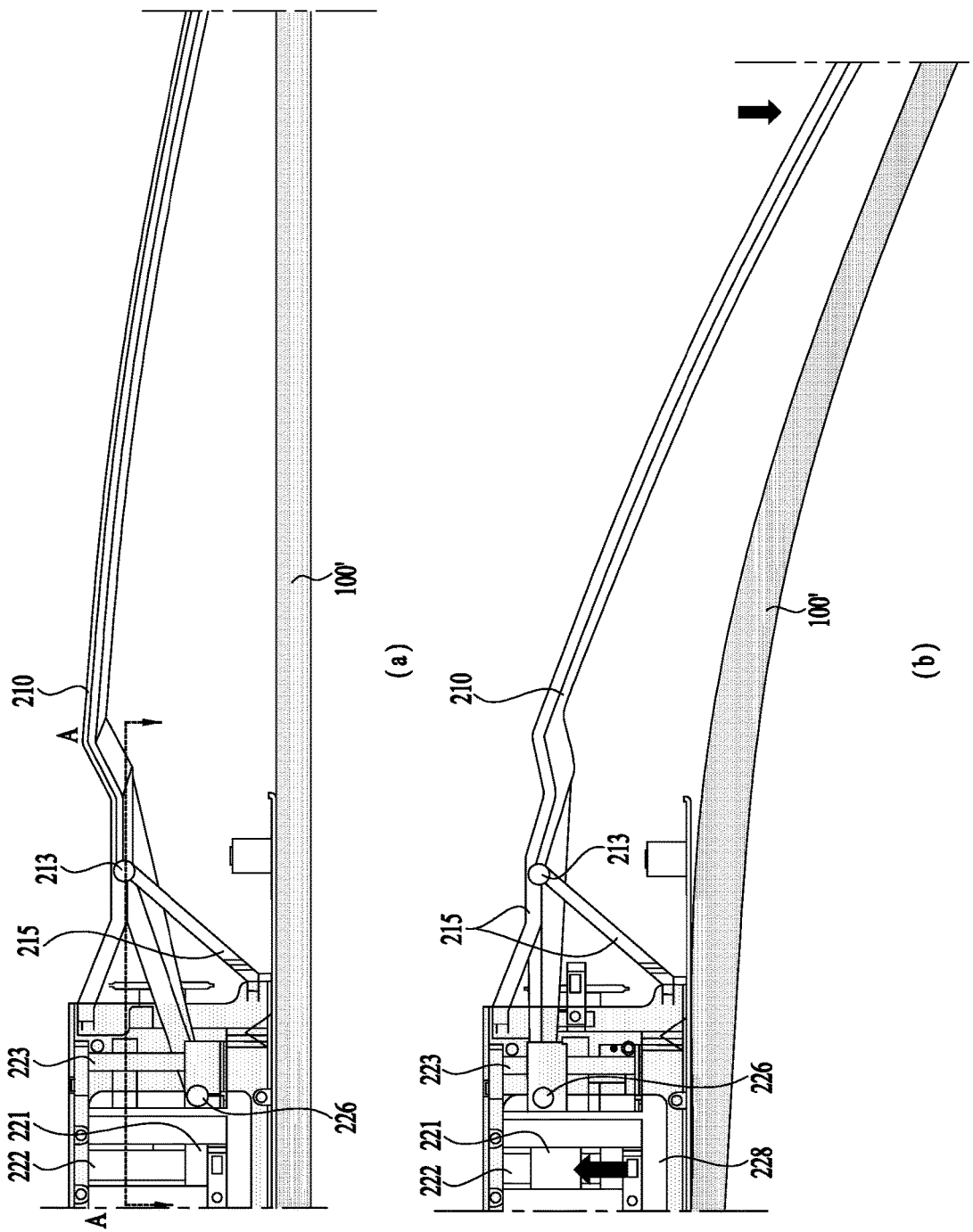
FIG. 5 is a top view illustrating a display device according to an embodiment of the present disclosure.

FIG. 5 is a top view illustrating the display device 100 according to an embodiment of the present disclosure. As shown in FIGS. 5(*a*) and 5(*b*), the curvature of the display device 100 may be changed according to the angle formed by the pair of links 210. The angle of the pair of links 210 may be adjusted according to a change in the position of the moving block 221 of the bending module 220.

The other end of the pair of links 210 may be slidably coupled to the link bracket 230. When the link bracket 230 is fixed to the link bracket 230, the curvature of the display module 150 is large at the end thereof so that it is difficult to implement a natural curved surface of the display module 150.

Accordingly, if the angle of the pair of links 210 is adjusted by the bending module 220, the other end of the link 210 slidably moves on the link bracket 230, so that a natural curved surface of the display module 150 can be implemented.

The bending module 220 may include a moving block 221 connected to one end of the link 210 and movable forward and backward, a guide shaft 222 for guiding the moving block 221 to move forward and backward without moving in the horizontal direction, and a module bracket 228 for receiving the bending module 220.

The link 210 is rotatably coupled to the link fixing unit 215 extending from the bending module 220. The link 210 may rotate around the link fixing pin 213 fastened to the link fixing unit 215, and one end and the other end of the link 210 may move in opposite directions.

When the user pulls the horizontal ends SS1 and SS2 of the main body 100' in a forward direction, the bending module 220 may allow the other end of the link 210 located on the horizontal ends SS1 and SS2 of the main body 100' to move in a forward direction, the link 210 may rotate around the link fixing pin 213, and one end of the link 210 may move in a backward direction.

In contrast, when the user pushes the horizontal ends SS1 and SS2 of the main body 100' in a backward direction so as to use the display device as a flat display, the other end of the link 210 may move backward and one end of the link 210 may move forward. A coupling position of the link fixing pin 213 may be located closer to one end of the link 210 than the other end of the link 210, and the movement distance of one end of the link 210 may be shorter than the movement distance of the other end of the link 210.

As described above, the user may manually change the curvature of the display device 100 by applying force to the horizontal ends SS1 and SS2 of the main body 100. At this time, the pair of links 210 is synchronized with the bending module 220 and simultaneously moved. As a result, the other side SS2 can also move at the same time when the user pulls or presses one side SS1 of the main body 100'.

However, according to the manual driving method, the user may apply force directly to the display module 150, there is a high risk of damage to the display module 150, and a motor is provided in the bending module 220, so that the curvature of the display module 150 can be changed.

For example, the guide shaft 222 may be formed in a spiral shape, and a spiral groove corresponding to the spiral of the guide shaft 222 may be formed in the moving block 221. When the motor rotates the guide shaft 222, the moving block 221 may move forward and backward.

When the moving block 221 of the bending module 220 moves backward, one end of the link 210 coupled to the moving block 221 moves backward, the other end of the link 210 moves forward, and the angle of the pair of links 210 may vary. The bending module 220 may induce a change in the angle of the links 210, and the display module 150 may again transition to the bent state or the flat state.

The display device 100 may further include a back cover 103 for covering the bending module 220 and the controller, and may further include a stand 260 for holding the main body 100' of the display device 100 on the floor. Instead of the stand 260, the display device 100 may further include a wall bracket that can be installed on the wall, and the stand 260 and the wall bracket may be coupled to the back cover 103.

In addition, the moving block 221 according to the present embodiment may move forward and backward along the guide shaft 222 protruding from the back surface of the main body 100'. One end of the link 210 may be coupled to the moving block 221, and may be rotatably coupled to the moving block 221 through the operation pin 226 to change the angle thereof according to movement of the moving block 221.

Hereinafter, specific embodiments of the display device described above will be described with reference to FIGS. 1 to 5. However, in FIGS. 1 to 5, the display device (hereinafter referred to as a bendable display device) capable of changing the curvature thereof has been mainly described for convenience of description, the scope or spirit of the present disclosure is not limited thereto, and the following description will be given centering upon an embodiment capable of being implemented in the display device including the bendable display device.

FIG. 6 is a diagram illustrating a light structure of the display device according to an exemplary embodiment of the present disclosure. Hereinafter, descriptions overlapping with the above-described drawings will herein be omitted for brevity.

FIG. 6(a) is a diagram illustrating a rear structure of the display device, and FIG. 6(b) is a diagram illustrating a detailed light structure.

Referring to FIG. 6(a), the display device may further include a back cover 103 for covering the main body 100' and the controller (not shown). Alternatively, unlike the back cover 103, the display device may be manufactured in a wider shape as shown in FIG. 6(a). In this case, the display device may include at least one light (601, 602, 603, 604, 605, 606). At this time, the at least one light (601, 602, 603, 604, 605, 606) may include six LED bars. Here, the LED bar may be a lamp in which LED elements are arranged in a long length, and may correspond to an electronic lamp that emits light by flowing a current after LEDs were arranged at regular intervals through a stick or pipe. The LED bar may be manufactured to have various lengths and various shapes (such as an aluminum LED bar, a lens-type LED bar, a waterproof LED bar, etc.), and may have flexibility depending on the material types.

Referring to FIG. 6(b), at least one light 601, 602, 603, 604, 605, 606 may be attached on the back cover 103. At this time, the at least one light 601, 602, 603, 604, 605, and 606 may be symmetrical with respect to a vertical axis. More specifically, each of the first LED bar 601 and the second LED bar 602 may have a bar structure in which a vertical length is longer than a horizontal length. The third LED bar 603, the fifth LED bar 605, the fourth LED bar 604, and the sixth LED bar 606 may be attached to the back cover 103 to form an X-shape. In particular, each of the third LED bar 603 and the fourth LED bar 604 are longer in length than each of the fifth LED bar 605 and the sixth LED bar 606.

However, the exemplary embodiments of the present disclosure are not limited to the light structure of FIG. 6. For example, at least one light may include four LED bars that are respectively attached to the first long side (LS1), the second long side (LS2), the first short side (SS1), and the second short side (SS2) of the main body 100'.

Hereinafter, various embodiments of the display device shown in FIGS. 1 to 6 according to an exemplary embodiment of the present disclosure will be described with reference to FIGS. 7 to 13. The following exemplary operations can be performed through the control of the controller of the display device, but it is assumed that the following exemplary operations are performed by the display device for convenience of explanation.

Figure 7:
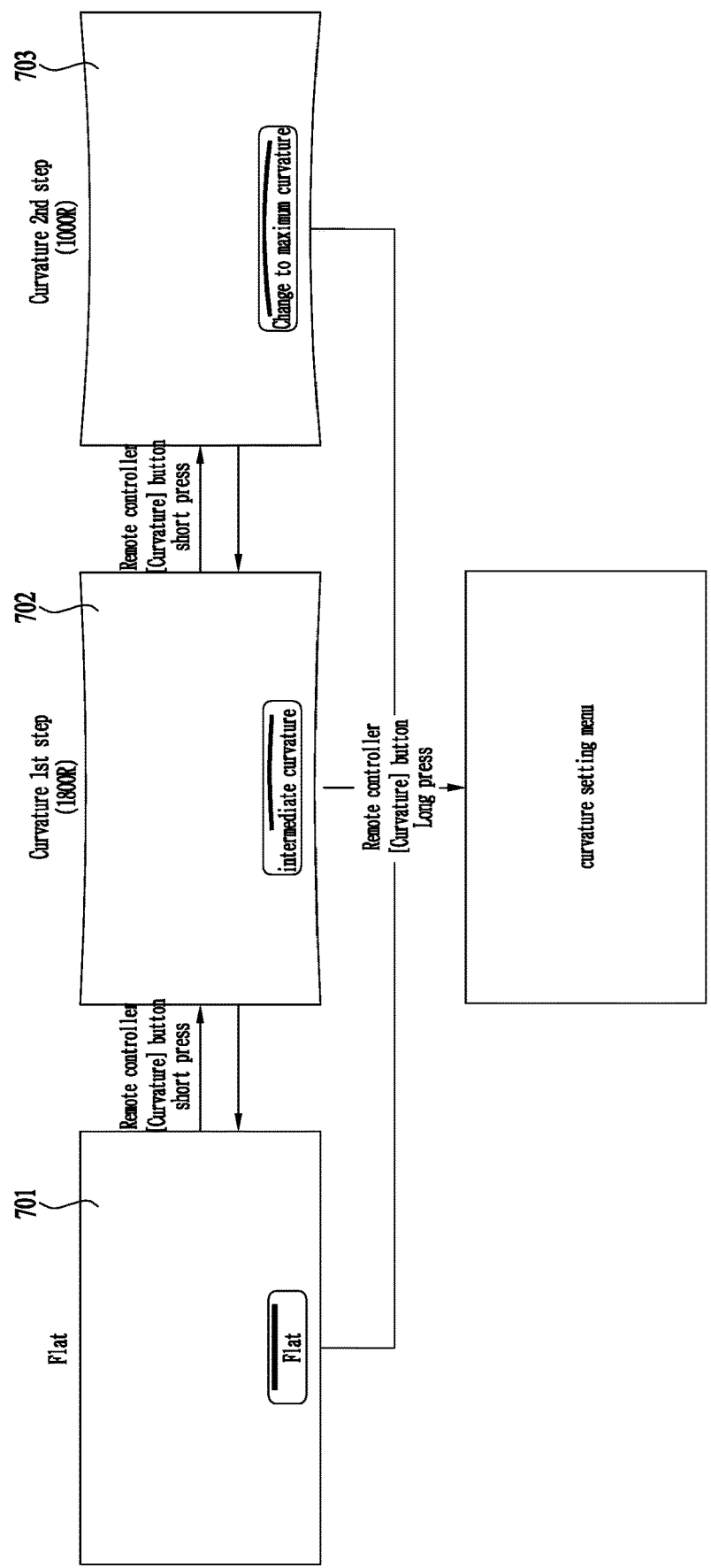
FIG. 7 is a diagram illustrating a basic operation of a display device according to an embodiment of the present disclosure.

FIG. 7 is a diagram illustrating a basic operation of the display device according to an embodiment of the present disclosure. Hereinafter, descriptions overlapping with the above-described drawings will herein be omitted for brevity.

In particular, FIG. 7 illustrates an operation scenario of a change in the curvature of the display module of the display device.

The display module of the display device may have a flat mode 701 in which the display module is flat, a first bending mode 702 in which the display module has a first curvature, and a second bending mode 703 in which the display module has a second curvature. Here, the first curvature is set to 1800R and the second curvature is set to 1000 R for convenience of description, but is not limited thereto. That is, the second curvature may correspond to a maximum curvature that the display module can have, and the first curvature and the second curvature may be determined when the display device is manufactured or may be set by user's setting as described below in FIG. 8.

Referring to FIG. 7, the display module of the display device may receive a first control signal for selecting a curvature button from the remote controller in a state where the display module is in the flat mode 701. Here, the first control signal for selecting the curvature button may correspond to an input signal generated when the user short-presses the curvature button of the remote controller.

According to one embodiment of the present disclosure, as the display module receives the first control signal generated by selection of the curvature button in a situation where the display module is in the flat mode 701, the display module can transition from the flat mode 701 to the first bending mode 702. That is, the display device can allow the bending module to change the curvature of the display module. The configuration of controlling the bending module to change the curvature of the display module may be shown in FIGS. 1 to 5.

According to one embodiment of the present disclosure, as the display device receives the first control signal generated by selection of the curvature button in a situation where the display module is in the first bending mode 702, the display device may switch the display module from the first bending mode 702 to the second bending mode 703.

That is, the display device may control the display module to be switched in the order of the first bending mode 702 and the second bending mode 703 based on the first control signal in a situation where the display module is in the flat mode 701.

Also, according to one embodiment of the present disclosure, as the display module receives a second control signal in a situation where the display module is in the second bending mode 703, the display device may allow the display module to transition from the second bending mode 703 to the first bending mode 702. As the display module receives the second control signal in a situation where the display module is in the first bending mode 702, the display module can transition from the first bending mode 702 to the flat mode 701.

That is, the display device can switch the display module in the order of the first bending mode 702 and the flat mode 701 based on the second control signal in a situation where the display module is in the second bending mode 703. In this case, the second control signal may be the same control signal as the first control signal or may be a different control signal from the first control signal. For example, the first control signal may correspond to a signal generated when the curvature-UP button of the remote controller is selected, and the second control signal may correspond to a signal generated when the curvature-down button of the remote controller is selected.

Also, according to one embodiment of the present disclosure, as the display module receives a third control signal in a situation where the display module is in the first bending mod 702 and the second bending mode 703, the display device may output the curvature setting menu. At this time, unlike the first control signal and the second control signal, the third control signal may correspond to a signal generated when the user long-presses the curvature button of the remote controller. This will be described in detail with reference to FIG. 8.

Figure 8:
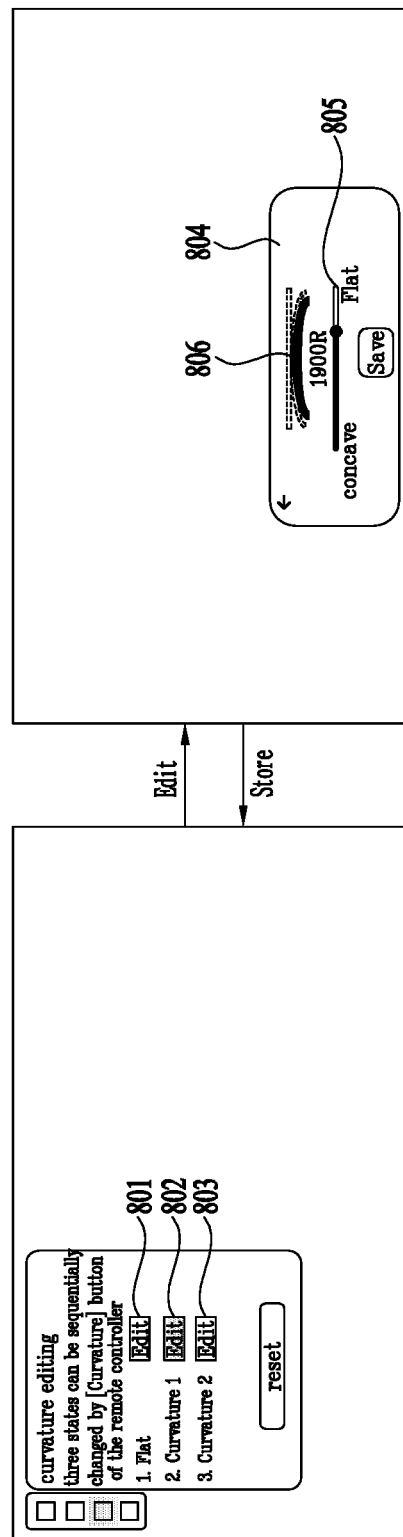
FIG. 8 is a diagram illustrating a curvature setting menu of a display device according to an embodiment of the present disclosure.

FIG. 8 is a diagram illustrating the curvature setting menu of the display device according to an embodiment of the present disclosure. Hereinafter, descriptions overlapping with the above-described drawings will herein be omitted for brevity.

Referring to FIG. 8, as the display module receives the third control signal in a situation where the display module is in an arbitrary mode as shown in FIG. 7, the display device may output the curvature setting menu.

As can be seen from the left side of FIG. 8, the display device may output a flat mode editing icon 801, a first bending mode editing icon 802, and a second bending mode editing icon 803 through the curvature setting menu.

According to one embodiment of the present disclosure, the display device may receive a control signal that selects the flat mode editing icon 801, the first bending mode editing icon 802, and the second bending mode editing icon 803. For example, the display device may receive an input signal generated by short-pressing of the first bending mode editing icon 802 from the remote controller. Hereinafter, the following description will be given with reference to the embodiment for receiving the control signal generated by selection of the first bending mode editing icon 802, the scope or spirit of the present disclosure is not limited thereto, and it should be noted that the curvature can also be changed in each of the flat mode and the second bending mode through the same method as the above-described method.

Referring to the right drawing of FIG. 8, as the display device receives a control signal required to select the first bending mode editing icon 802, the display device may output the first bending mode editing pop-up window 804.

The first bending mode editing pop-up window 804 may include a slider 805 for finely adjusting the curvature of the display module. The display device may determine the curvature of the first bending mode based on a control signal that adjusts the slider 805. At this time, the curvature of the display module can be precisely adjusted through the slider 805 in units of 100R within the range from 1000R to a flat level. The user can set the curvature of the first bending mode while enabling the slider 805 to move horizontally in the direction from the left side (corresponding to the curved mode) to the right side (corresponding to the flat mode). At this time, the display device may output the curvature of the first bending mode set by the user as a preview 806 through the first bending mode editing pop-up window 804.

In the same manner as described above, the display device may set the flat mode, the first bending mode and the second bending mode according to the user setting. That is, the display device may store the curvature that is individually set by the user in addition to the preset curvatures of the flat mode, the first bending mode, and the second bending mode that have been set at the time of shipment. In this case, the display device may store the user-setting curvature in the above-described memory.

Then, when the display device receives a control signal selecting the first bending mode from the user based on the stored curvature, the display module can switch the display module to the changed curvature according to the user setting.

Figure 9A:
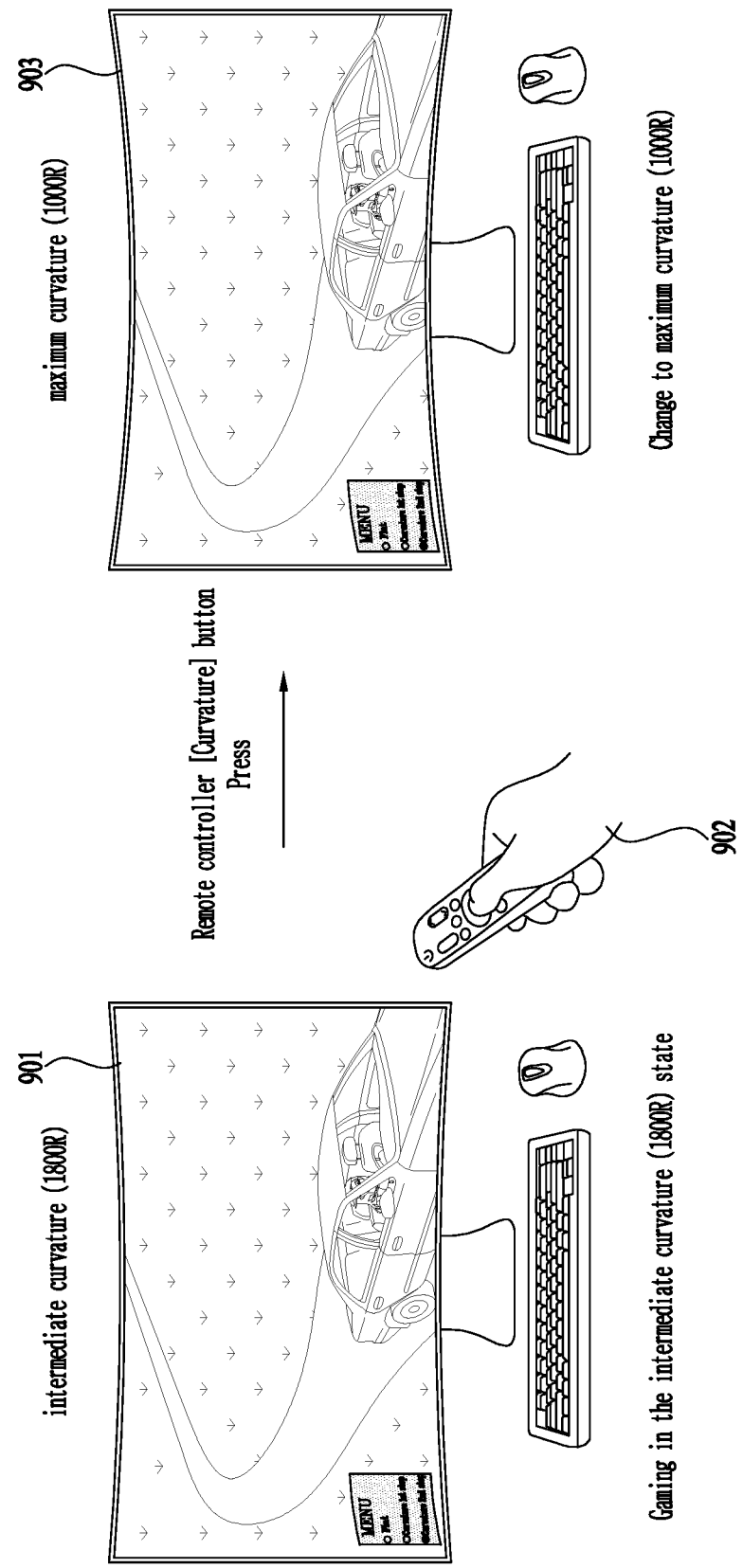
FIGS. 9A and 9B are diagrams illustrating a method for switching a mode of a display module to another mode based on images output from the display device according to an embodiment of the present disclosure.
Figure 9B:
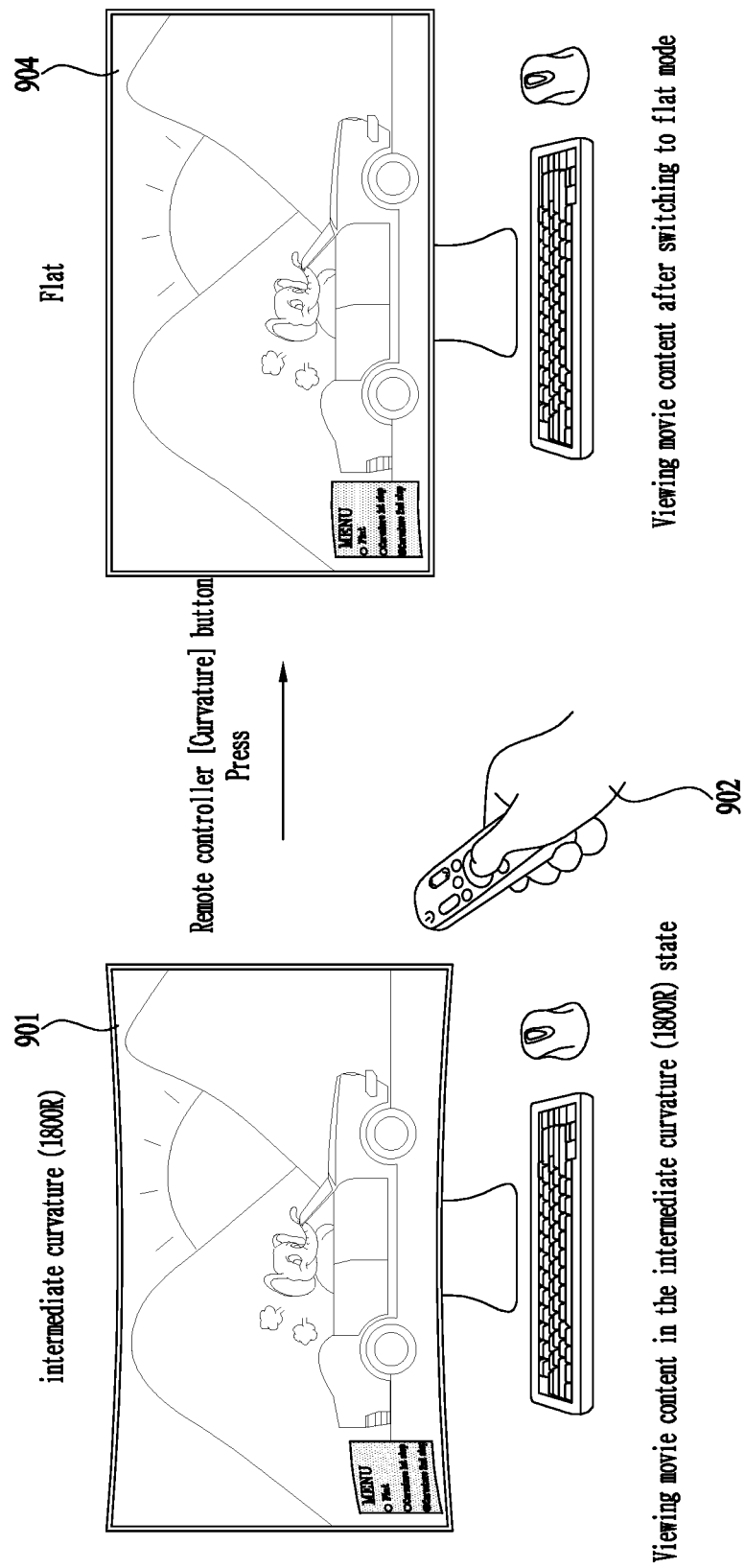

FIGS. 9A and 9B are diagrams illustrating a method for switching a mode of the display module to another mode based on images output from the display device according to an embodiment of the present disclosure. Hereinafter, descriptions overlapping with the above-described drawings will herein be omitted for brevity.

The display device may switch the display module to any one of the flat mode, the first bending mode, and the second bending mode based on an image output from the display module.

More specifically, the display device can operate the display module in consideration of the image currently being output from the display module, instead of considering the operation scenario of the curvature change described above in FIG. 7.

Referring to FIG. 9A, the display device may receive a control signal 902 from the remote controller in a state where the display module is in a first bending mode 901. Here, a control signal 902 may correspond to an input signal generated when the user short-presses the curvature button of the remote controller, as described above in FIG. 7.

In the embodiment of FIG. 9A, the display module is characterized in that game content is being output in a state where the display module is in the first bending mode 901. At this time, the display device can acquire information about the content that is currently being output through other information (e.g., metadata) received together when receiving the content.

According to one embodiment of the present disclosure, the display device may switch the display module to the second bending mode 903 in a state where the display module in the first bending mode 901 is outputting the game content.

That is, in the same manner as in the operation scenario of FIG. 7, the display device according to the embodiment of FIG. 9A can switch the display module from the first bending mode 901 to the second bending mode 903 upon receiving the control signal 902.

On the other hand, referring to FIG. 9B, the display device is characterized in that the display module is outputting any one of movie content, drama content, or image output content in a state where the display module is in the first bending mode 901. Here, the movie content does not simply specify a movie, but may refer to various image output content (such as webtoons, dramas, and web browsers) that are easy for the user to statically view. Similar to the embodiment of FIG. 9A, the display device may acquire information about the content currently being output through other information to be received when receiving the content.

According to one embodiment of the present disclosure, when the display device receives the control signal 902 in a state where the display module in the first bending mode 902 is outputting the movie content, the display module may transition to the flat mode 902. In this case, the control signal 902 may be the same as that of FIG. 9A.

That is, the display device may switch the display module from the first bending mode 901 to the second bending mode 903 or the flat mode 904 based on the image being output from the display module.

This means that the display device interprets the intention of the user's control signal 902 generated when the display module outputs the game content to switch a mode of the display module to another mode corresponding to a maximum curvature, and also interprets the intention of the user's control signal 902 generated when the display module outputs the movie content to switch a mode of the display module to a flat mode.

Accordingly, although the user who views the display device inputs the same control signal 902, the display device can switch a mode of the display module to another mode based on the content currently being output.

Figure 10:
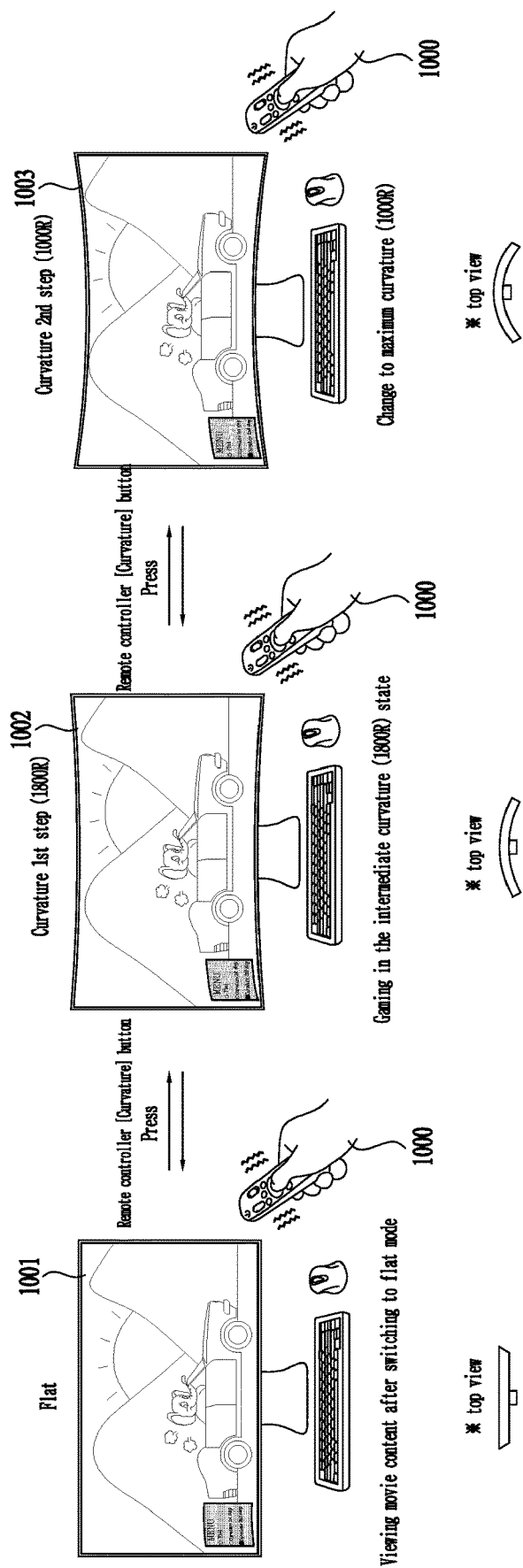
FIG. 10 is a diagram illustrating a method for enabling the display device to control a remote controller according to an exemplary embodiment of the present disclosure.

FIG. 10 is a diagram illustrating a method for enabling the display device to control the remote controller according to an exemplary embodiment of the present disclosure. Hereinafter, descriptions overlapping with the above-described drawings will herein be omitted for brevity.

Upon receiving a control signal 1000 for switching the mode of the display module to another node from the remote controller, the display device may transmit a control signal for vibrating the remote controller to the remote controller.

More specifically, the display device may switch the display module to any one of the flat mode 1001, the first bending mode 1002, and the second bending mode 1003. At this time, the display device may receive the control signal 1000 for switching the mode of the display module to another mode from the remote controller.

Upon receiving the control signal 1000, the display device may switch the display module to any one of the flat mode 1001, the first bending mode 1002, and the second bending mode 1003, and at the same time may control the remote controller to vibrate.

Accordingly, the user who holds the remote controller can recognize that the display module is being switched to any one of the flat mode 1001, the first bending mode 1002, and the second bending mode 1003.

Figure 11:
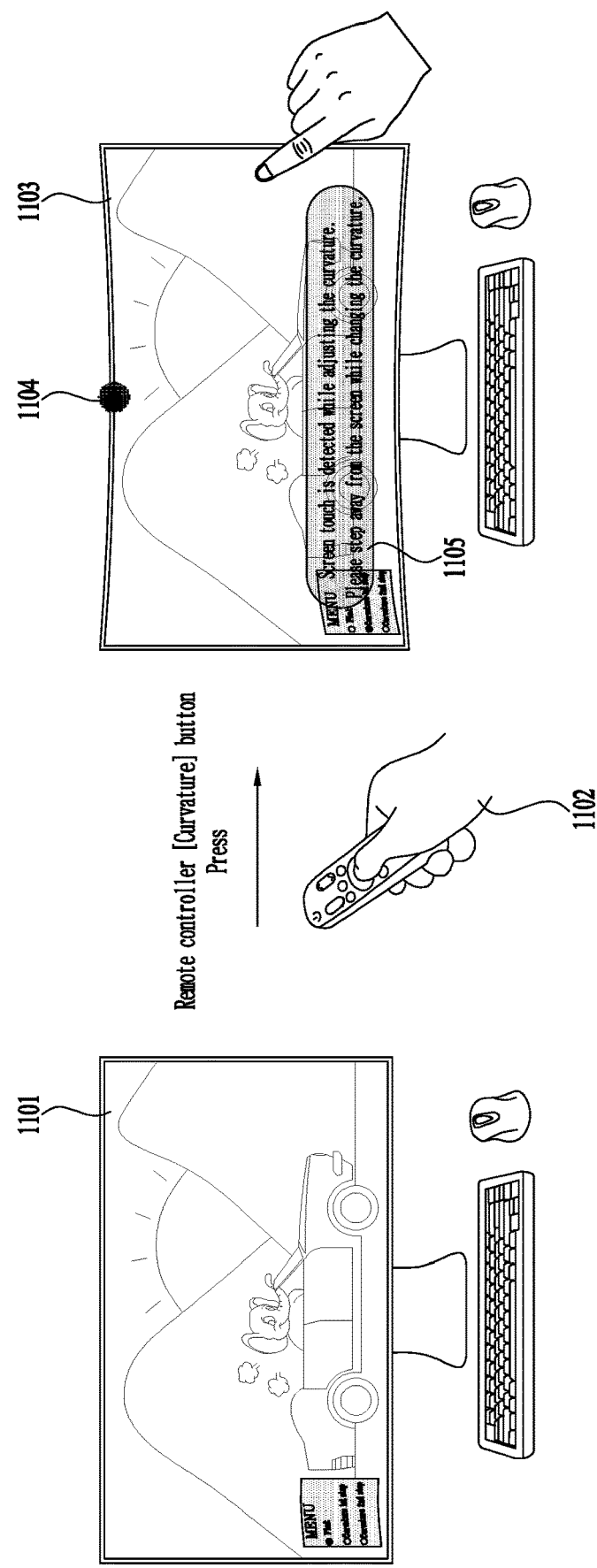
FIG. 11 is a diagram illustrating a method for sensing movement by a motion sensor of a display device according to an embodiment of the present disclosure.

FIG. 11 is a diagram illustrating a method for sensing movement by a motion sensor of the display device according to an embodiment of the present disclosure. Hereinafter, descriptions overlapping with the above-described drawings will herein be omitted for brevity.

The display device may further include a motion sensor. Here, the motion sensor is any electronic device capable of detecting movement of a target object. The motion sensor may include at least one sensor for recognizing the movement and position of the target object and inputting the recognized information, and may include software for inputting and analyzing data collected from the sensors. In one embodiment of the present disclosure, the motion sensor 1104 may be embedded in a central portion of an upper end of the display module.

Referring to FIG. 11, the display device including the motion sensor may receive a control signal 1102 for controlling the display module to switch from the flat mode 1101 to the first bending mode 1103 from the remote controller.

The display device may sense movement of the object through the motion sensor 1104 in a process of switching the display module from the flat mode 1101 to the first bending mode 1103. For example, the motion sensor 1104 may sense movement of the companion animal or child moving in front of the display module.

The display device may stop mode switching of the display module when the display module detects movement of the object in the process of switching from the flat mode 1101 to the first bending mode 1103. Further, the display device may output an alarm 1105 on the display module when the display module senses the movement of the object in the process of switching from the flat mode 1101 to the first bending mode 1103. For example, the display device may output a pop-up window or output a warning sound as the alarm 1105.

In one embodiment of the present disclosure, the display device may activate the motion sensor 1104 upon receiving the control signal 1102 for switching the mode of the display module. That is, the motion sensor 1104 of the display device may be kept in a deactivated state for power saving at ordinary times. Upon receiving the control signal 1102, the motion sensor 1104 may be activated.

Figure 12:
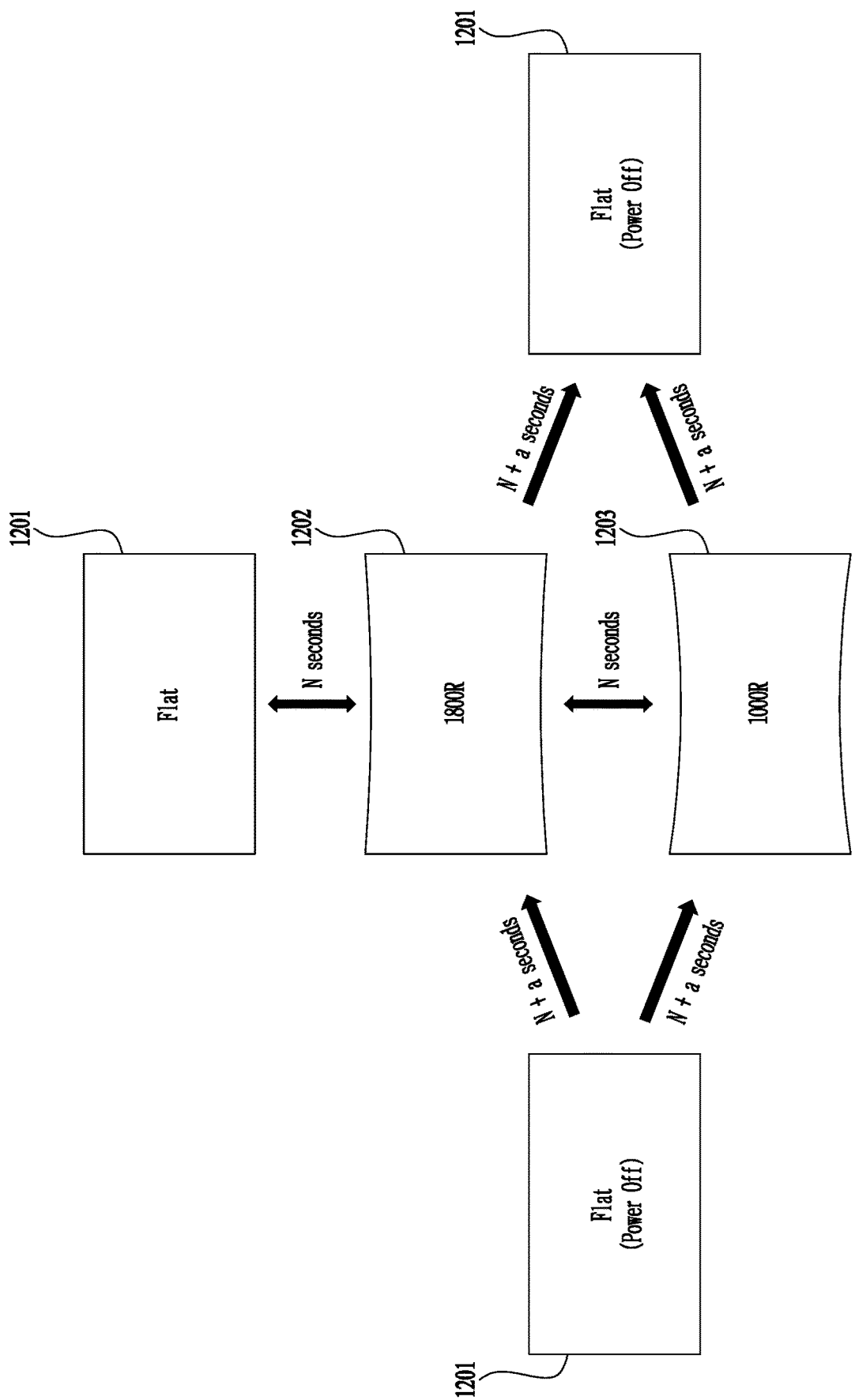
FIG. 12 is a diagram illustrating a method for adjusting a mode switching speed of a display module by a display device according to an embodiment of the present disclosure.

FIG. 12 is a diagram illustrating a method for adjusting a mode switching speed of the display module by the display device according to an embodiment of the present disclosure. Hereinafter, descriptions overlapping with the above-described drawings will herein be omitted for brevity.

When the display device performs mode switching of the display module in a state where the display module is powered on, the mode switching speed is controlled as a first speed. In a state where the display module is powered off, then the display device powers on the display module and at the same time performs mode switching of the display module, the mode switching speed is controlled at a second speed, and the second speed is lower than the first speed. In addition, the display device may receive a control signal for powering on or off the display module from the remote controller. A detailed description thereof will herein be omitted.

More specifically, in a situation where the display module is powered on, the display device may switch a mode of the display module to any one of the flat mode 1201, the first bending mode 1202, and the second bending mode 1203. In this case, in a situation where the display module is powered on, a transition time from the flat mode 1201 to the first bending mode 1202 of the display module is N seconds, and a time taken to switch from the first bending mode 1202 to the second bending mode 1203 may correspond to N seconds.

On the other hand, in a situation where the display module is powered off, when the display module is powered on and at the same time mode switching of the display module is performed, the time taken for such mode switching may correspond to (N+a) seconds. That is, when the display module is powered on and at the same time mode switching from the flat mode 1201 to the first bending mode 1202 is performed or other mode switching from the flat mode 1201 to the second bending mode 1203 is performed, the time taken for such mode switching of the display module may be controlled to be (N+a) seconds (where 'a' is a positive number)

Similarly, in a situation where the display module is in the first bending mode 1201 or the second bending mode 1203, when the display device powers off the display module and at the same time the mode of the display module is switched to the flat mode 1201, the time taken for such mode switching of the display module may be controlled to be (N+a) seconds.

Accordingly, in a situation where the display module is powered off, when the display module is powered on, the display device can prevent the curvature of the display module from being suddenly changed.

In addition, the above-described example has described the embodiment in which the flat mode 1201 is set to a default mode in a situation where the display module is powered off. Of course, even when the display module is powered off, the first bending mode 1202 or the second bending mode 1203 can be set to the default mode. In this case, in order to prevent sudden change in curvature, the display device can control the time taken to perform mode switching of the display module in a first state where the display module is powered off to be longer than the other time taken to perform mode switching of the display module in a second state where the display module is powered on.

Figure 13:
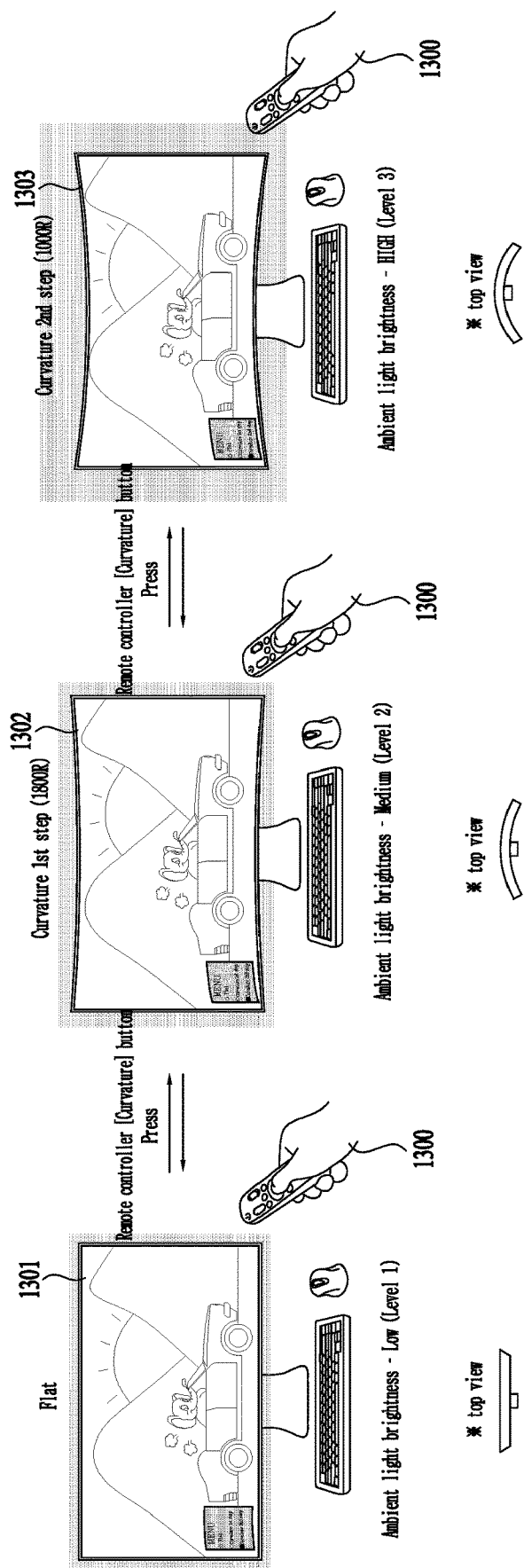
FIG. 13 is a diagram illustrating a method for changing brightness of light in response to mode switching of a display module by the display device according to an embodiment of the present disclosure.

FIG. 13 is a diagram illustrating a method for changing brightness of light in response to mode switching of the display module by the display device according to an embodiment of the present disclosure. Hereinafter, descriptions overlapping with the above-described drawings will herein be omitted for brevity.

Referring to FIG. 6, the display device according to the embodiment of the present disclosure may include at least one light on a back surface of the main body. Therefore, the display device may control at least one light to change brightness of light output from the at least one light based on a mode change of the display module.

More specifically, the display device may switch the display module to any one of the flat mode 1301, the first bending mode 1302, and the second bending mode 1303 based on the control signal 1300 received from the remote controller.

In this case, the display device may control brightness of the at least one light to be a first brightness when the display module is in the flat mode 1301, may control brightness of the at least one light to be a second brightness when the display module is in the first bending mode 1302, and may control brightness of the at least one light to be a third brightness when the display module is in the second bending mode 1303. In one embodiment of the present disclosure, the second brightness may be brighter than the first brightness, and the third brightness may be brighter than the second brightness. On the other hand, in accordance with user setting, the reverse order opposite to the above-described order of such brightness may also be possible as needed. For example, the first brightness may be brighter than the second brightness, and the second brightness may be brighter than the third brightness.

That is, the display device may set the brightness of at least one light to the first brightness when the display module is in the flat mode 1301, may sets the brightness of at least one light to the second brightness when the display module is in the first bending mode 1302, and may sets the brightness of at least one light to the third brightness when the display module is in the second bending mode 1303.

Accordingly, the user can experience more immersive content according to a change in light brightness as well as a change in curvature of the display module.

The present disclosure may be implemented as code that can be written to a computer-readable recording medium and can thus be read by a computer. The computer-readable recording medium may be any type of recording device in which data can be stored in a computer-readable manner. Examples of the computer-readable recording medium include a hard disk drive (HDD), a solid state drive (SSD), a silicon disk drive (SDD), a ROM, a RAM, a CD-ROM, a magnetic tape, a floppy disk, optical data storage, and a carrier wave (e.g., data transmission over the Internet). In addition, the computer may include the controller. The above exemplary embodiments are therefore to be construed in all aspects as illustrative and not restrictive. The scope of the invention should be determined by the appended claims and their legal equivalents, not by the above description, and all changes coming within the meaning and equivalency range of the appended claims are intended to be embraced therein.

Various embodiments of the present disclosure have been described in the previous table of contents "Best Mode for Implementing the Invention", and it should be understood by those skilled in the art that combining the embodiments described in two or more figures as necessary will fall within the scope of the present disclosure.

The present disclosure is applicable to display devices of various form factors such as, for example, a bendable display device, and thus is considered to be industrially applicable.

As is apparent from the above description, the display device according to the embodiments of the present disclosure can enable a display module to be transformed into a flat mode or a bending mode, so that the user can easily use the display module implemented as a user desired format.

The display device according to the embodiments of the present disclosure can maximize the visual effect that can be felt by a user who views images displayed on the display device through ambient light.

It will be apparent to those skilled in the art that various modifications and variations can be made in the present disclosure without departing from the spirit or scope of the inventions. Thus, it is intended that the present disclosure covers the modifications and variations of this invention provided they come within the scope of the appended claims and their equivalents.

What is claimed is:

1. A display device comprising:
a display;
an actuator located at a rear of the display device;
a motion sensor; and
a processor,
wherein:
the processor is configured to control the actuator to change a curvature of the display to any one of a flat mode in which the display is flat, a first bending mode in which the display has a first curvature, or a second bending mode in which the display has a second curvature; and
the second curvature is a maximum curvature of the display,
wherein:
changing the curvature of the display to the flat mode, the first bending mode, or the second bending mode while the display device is already powered on is performed at a first speed; and
changing the curvature of the display to the flat mode, the first bending mode, or the second bending mode in response to the display device being powered on or off is performed at a second speed,
wherein the first speed is faster than the second speed, and
wherein:
the processor is further configured to activate the motion sensor upon receiving a control signal for mode switching of the display; and
based on movement of an object being detected within a preset range by the motion sensor, the processor is further configured to output a pop-up window through the display.

2. The display device according to claim 1, wherein the processor is further configured to control the actuator to change the curvature of the display to any one of the flat mode, the first bending mode, or the second bending mode based on the image that is output at the display.

3. The display device according to claim 2, wherein: based on receiving a control signal for mode switching of the display in a state where the display is operating in the first bending mode and outputting game content, the processor is further configured to switch the display to the second bending mode.

4. The display device according to claim 2, further comprising:
based on receiving a control signal for mode switching of the display in a state where the display is operating in the first bending mode and outputting any one of movie content, drama content, or web-browser content, the processor is further configured to switch the display to the flat mode.

5. The display device according to claim 1, wherein: based on receiving a control signal for adjusting the curvature of the display, the processor is further configured to output a curvature setting menu through the display, and control the curvature of the display to be adjusted in units of 100R (Radius) through the curvature setting menu.

6. The display device according to claim 5, further comprising:
a memory, wherein the processor is further configured to store, in the memory, information about the curvature adjusted in units of 100R, and control the actuator to change the curvature of the display based on the adjusted curvature.

7. The display device according to claim 1, wherein:
upon receiving a control signal for mode switching of the display from a remote controller, the processor is further configured to transmit, to the remote controller, a signal for controlling the remote controller to vibrate.

8. The display device according to claim 1, wherein:
the processor is further configured to stop mode switching of the display based on movement of the object being detected within the preset range by the motion sensor.

9. The display device according to claim 1, further comprising:
at least one light,
wherein the processor is further configured to control the at least one light to change brightness of light being output from the at least one light based on a mode change of the display.

10. The display device according to claim 9, wherein:
the at least one light includes six light emitting diode (LED) bars,
wherein the six LED bars are symmetrical to each other with respect to a vertical axis.

11. The display device according to claim 9, further comprising:
a back cover configured to cover the main body and the processor,
wherein the at least one light is disposed on the back cover.

12. A display device comprising:
a display;
an actuator located at a rear of the display device; and
a processor configured to control the actuator to change a curvature of the display to any one of a flat mode in which the display is flat, a first bending mode in which the display has a first curvature, or a second bending mode in which the display has a second curvature,
wherein:
the second curvature is a maximum curvature of the display,
changing the curvature of the display to the flat mode, the first bending mode, or the second bending mode while the display device is already powered on is performed at a first speed;
changing the curvature of the display to the flat mode, the first bending mode, or the second bending mode in response to the display device being powered on or off is performed at a second speed,
the first speed is faster than the second speed, and
the display device further comprises:
a pair of links having one end coupled to the actuator, and extending along a horizontal direction; and
a link bracket disposed at left and right ends of the main body and coupled to the other end of the links,
wherein the actuator includes:
a guide shaft extending from a back surface of the main body; and
a block through which the guide shaft is inserted, the block configured to move forward and backward,
wherein based on the block moving forward and backward along the guide shaft, an angle between the links is changed and the curvature of the display module is also changed.

13. A method for controlling a display device the method comprising:
outputting an image via a display of the display device; and
controlling an actuator located at a rear of the display device to change a curvature of the display to any one of a flat mode in which the display is flat, a first bending mode in which the display has a first curvature, or a second bending mode in which the display has a second curvature,
wherein the second curvature is a maximum curvature of the display,
wherein:
changing the curvature of the display to the flat mode, the first bending mode, or the second bending mode while the display device is already powered on is performed at a first speed; and
changing the curvature of the display to the flat mode, the first bending mode, or the second bending mode in response to the display device being powered on or off is performed at a second speed,
wherein the first speed is faster than the second speed, and
wherein the method further comprises:
activating a motion sensor of the display device upon receiving a control signal for mode switching of the display; and
outputting a pop-up window through the display based on movement of an object being detected within a preset range by the motion sensor.

* * * * *